(12) United States Patent
Ishikura et al.

(10) Patent No.: US 6,838,736 B2
(45) Date of Patent: Jan. 4, 2005

(54) SEMICONDUCTOR DEVICE HAVING NOISE IMMUNITY

(75) Inventors: Satoshi Ishikura, Osaka (JP); Yukio Iijima, Nara (JP); Nobuaki Minakuchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 172 days.

(21) Appl. No.: 09/837,450

(22) Filed: Apr. 19, 2001

(65) Prior Publication Data

US 2002/0079556 A1 Jun. 27, 2002

(30) Foreign Application Priority Data

Dec. 22, 2000 (JP) ........................................ 2000-389753

(51) Int. Cl.[7] .............................................. H01L 29/94
(52) U.S. Cl. ...................................... 257/377; 257/368
(58) Field of Search ................................ 257/368, 369, 257/372, 373, 374, 375, 377, 509, 510, 508, 500

(56) References Cited

U.S. PATENT DOCUMENTS

| 5,464,996 | A | * | 11/1995 | Hynecek ..................... 257/230 |
| 5,479,045 | A | * | 12/1995 | Narahara et al. ............ 257/533 |
| 5,729,040 | A | * | 3/1998 | Sano .......................... 257/504 |
| 5,867,434 | A | * | 2/1999 | Oh et al. ..................... 365/200 |
| 5,998,843 | A | * | 12/1999 | Yoshida ....................... 257/370 |
| 6,103,592 | A | * | 8/2000 | Levy et al. ................. 438/424 |
| 6,285,177 | B1 | * | 9/2001 | Mallikarjunaswamy et al. . 323/315 |
| 6,346,736 | B1 | | 2/2002 | Ukeda et al. |
| 6,366,322 | B1 | * | 4/2002 | Lee et al. ..................... 348/314 |
| 2001/0052620 | A1 | | 12/2001 | Ipposhi et al. |

FOREIGN PATENT DOCUMENTS

| JP | 3-53561 | 3/1991 |
| JP | 10-154751 | 6/1998 |
| JP | 10-173035 | 6/1998 |
| JP | P2001-118988 A | 4/2001 |
| JP | P2001-168205 A | 6/2001 |
| JP | P2002-76111 A | 3/2002 |

OTHER PUBLICATIONS

S. Wolf. 1990. Lattice Press, vol. 2, pp. 17–50.*

* cited by examiner

*Primary Examiner*—Eddie Lee
*Assistant Examiner*—Douglas W. Owens
(74) *Attorney, Agent, or Firm*—McDermott Will & Emery LLP

(57) ABSTRACT

A semiconductor device, including a dummy diffused layer in the upper part of a substrate, has its noise immunity improved. The dummy diffused layer is formed between analog and digital blocks to eliminate dishing, which usually occurs during a CMP process for defining STI regions. The surface of the dummy diffused layer is covered with an anti-silicidation film at least partially and a dummy gate electrode so as not to be silicided. The dummy gate electrode can be formed along with a normal gate electrode for a transistor. Accordingly, there is no need to add any extra process step to the fabrication process.

18 Claims, 17 Drawing Sheets

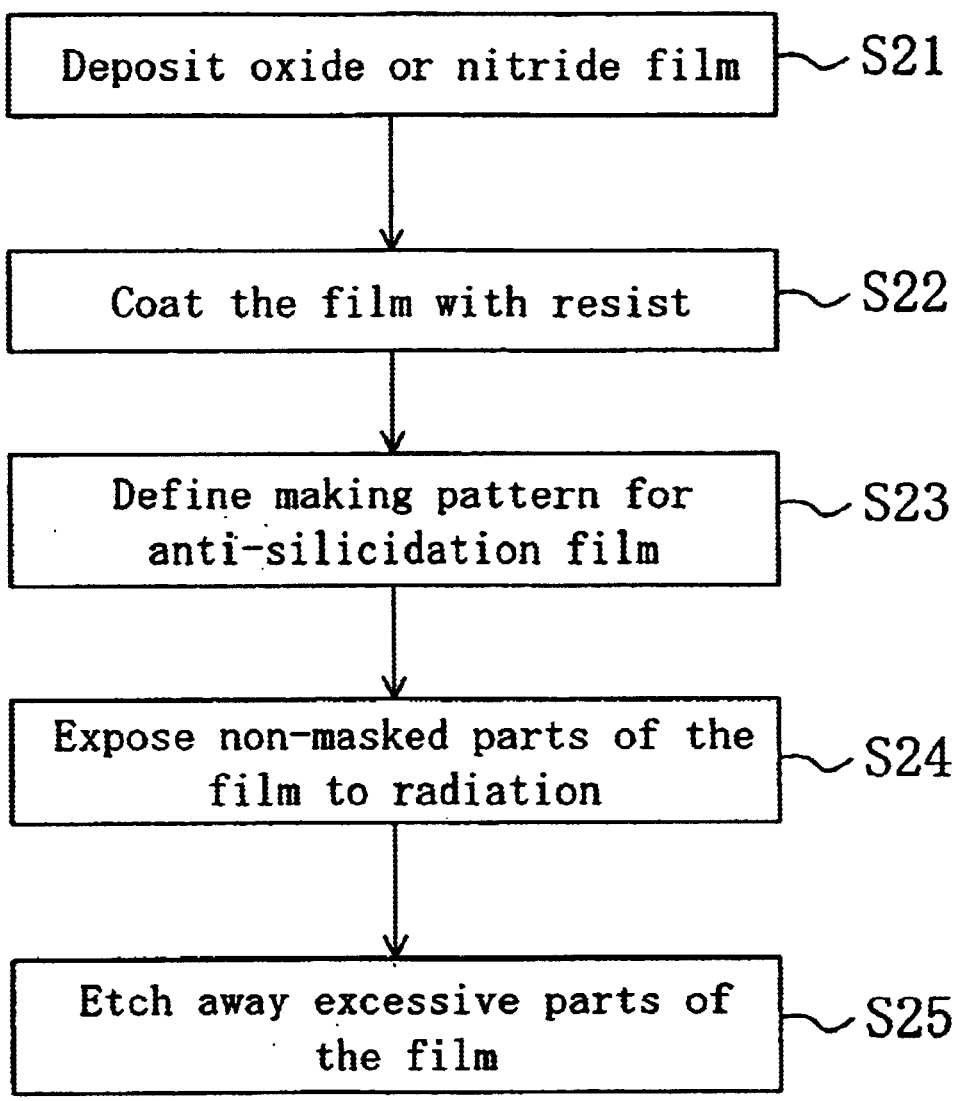

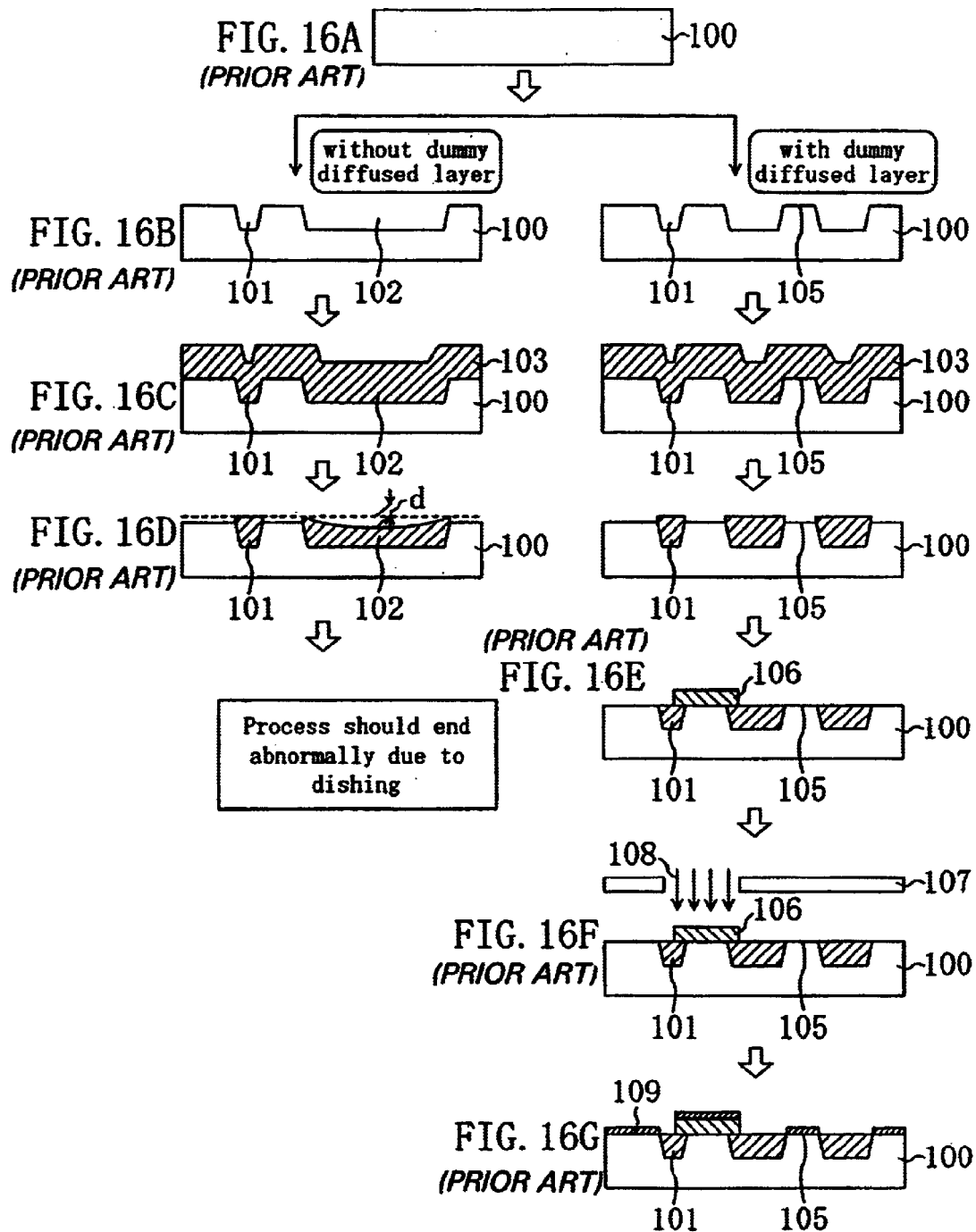

SEMICONDUCTOR DEVICE HAVING NOISE IMMUNITY

BACKGROUND OF THE INVENTION

The present invention generally relates to measures to be taken to increase the noise immunity of a semiconductor device. More particularly, this invention relates to a technique of enhancing the noise immunity of a semiconductor device including not only an STI (shallow trench isolation) structure and a silicide diffused layer but also a dummy diffused layer for use in eliminating dishing, for example.

In the past, a LOCOS isolation technique was often used to electrically isolate the active region of devices included in a semiconductor integrated circuit. Recently, however, an STI process is adopted more and more frequently to define even finer patterns. This tendency manifested itself when the design rule for LSIs reached 0.25 µm or 0.18 µm.

On the other hand, silicidation techniques have also been preferred lately. A silicidation technique is applicable to a process of forming a titanium or cobalt alloy layer, for example, on the upper surface of a diffused layer or a gate electrode. The silicidation was found effective because of several different reasons. Firstly, reduction in design rule for a semiconductor process has decreased the cross-sectional areas of diffused layer, gate electrode, contacts and so on. Accordingly, it is now much more necessary to reduce the parasitic resistance. Secondly, in forming a diode with a dual-gate structure, the gate electrodes of p- and n-channel transistors included in the diode should be "backed". As used herein, "backing" means connecting a low-resistivity conductor in parallel to the electrode.

It will be described in further detail why the "backing" is necessary.

In processes for the devices in 5 to 3 V supply voltage generations, the p-channel transistor used to have a buried channel, the n-channel transistor a surface channel and the gate electrodes of these transistors used to be made of n-type polysilicon. However, a supply voltage for an LSI has been reduced at a tremendously high rate (e.g., at an interval of about two years) these days. Specifically, a supply voltage of 3.3 V, which was a commonplace around ten years ago, has been replaced with 2.5 V, 1.8 V, 1.5 V, and so on. Even though the supply voltage has been reduced this way, the drive current still should be kept high with the standby current minimized. To meet those needs, a dual-gate process is preferably performed so that the p-channel transistor, as well as the n-channel transistor, may also have a surface channel.

To realize a dual-gate structure, however, the gate electrode of the n-channel transistor should be of n-type, while that of the p-channel transistor should be of p-type. Accordingly, a pn junction diode is unintentionally formed at the junction between the p- and n-type gates. Where such a diode exists between these transistors, a signal potential cannot change its level fully, thus making it very difficult to design an LSI normally.

For that reason, a low-resistivity silicide interconnect is formed on the gate electrodes to "back" them. In that case, there is no need for the designer to provide any additional interconnection layer for the backing purposes during the layout stage. As a result, the efficiency of the design process improves. In addition, the silicidation also contributes to reducing a cell area and utilizing an interconnection layer much more efficiently. Accordingly, the majority of those skilled in the art now adopt the silicidation for a dual-gate process.

FIG. 15 illustrates a schematic flow of a semiconductor device fabrication process including the steps of forming an STI structure and performing a silicidation process. FIGS. 16A through 16G are cross-sectional views illustrating schematic structures, corresponding to respective process steps for fabricating a semiconductor device, according to the flow illustrated in FIG. 15.

First, in Step S11 of forming STI regions, parts of a silicon substrate 100, where STI regions 101 and 102 will be defined, are etched to a predetermined depth by using a mask for defining diffused regions to form openings as shown in FIG. 16B. Next, the openings are filled with a field oxide film 103 as a material for the STI regions 101 and 102 as shown in FIG. 16C. Then, excessive parts of the field oxide film 103, existing over the filled parts, are removed by a CMP (chemical/mechanical polishing) process, thereby planarizing the surface of the substrate as shown in FIG. 16D.

A CMP polish pad usually has some elasticity. Accordingly, if there is any STI region 102 with a large area, then the field oxide film 103 existing in the region 102 might be partially removed excessively around its center. As a result, that part of the field oxide film 103 might have its height decreased by a level difference d as shown in FIG. 16D. This unwanted phenomenon is called "dishing", which is often observable in a CMP process. The level difference d created in this manner (which will be herein called a "dishing level difference") will deform a pattern to be defined in a subsequent lithographic process because the depth of focus will be insufficient. In addition, the characteristics of the resultant transistor will also be affected eventually. To avoid these inconveniences, the dishing level difference d should be eliminated from the CMP process.

If a harder CMP polish pad is used, the dishing may be eliminated without modifying the flow of the fabrication process itself. However, it would be more effective to place a dummy diffused layer 105, in which no source/drain electrodes will be actually formed for the transistor, in the STI region 102 with a large area at the layout stage. If the dummy diffused layer 105 is formed through the process steps illustrated on the right-hand side of FIGS. 16B, 16C and 16D, then the polish pad will not be forced into the field oxide film 103 so strongly. As a result, the dishing level difference d can be substantially eliminated.

Thereafter, in Step S12, a polysilicon gate electrode 106 is formed on the substrate 101 as shown in FIG. 16E. Then, in Step S13, p- or n-type dopant ions 108 are implanted into the substrate 101 using a mask 107 to define source/drain regions as shown in FIG. 16F. Subsequently, in Step S14, the diffused regions and polysilicon gate electrode 106 are covered with a silicide layer 109 as shown in FIG. 16G. In this manner, all the process steps on the bulk portion of the wafer are finished. And then interconnects are formed in Step S15, thereby completing an LSI.

As described above, the dummy diffused layer is very effectively applicable to preventing the dishing phenomenon from occurring in forming the STI regions by a CMP process. The dummy diffused layer may also have beneficial effects on different types of processes (like lithographic and etching processes) other than the STI process. For example, to define a fine-line pattern for a diffused layer accurately by a lithographic process, the percentage of the area covered by the diffused layer to the area of a predetermined region may have to fall within a prescribed range in accordance with a process condition. In that situation, a dummy diffused layer may be have to be placed so that the area percentage of the diffused layer can fall within the prescribed range.

However, through experiments and modeling, the present inventor found that a dummy diffused layer like that might unintentionally encourage the propagation of noise among circuit blocks as the case may be.

Now, it will be described with reference to FIGS. 17A through 19B how I found the problem to be solved by the present invention.

Suppose an analog block 50 susceptible to noise and a digital block 51 operating at a high speed to generate a lot of noise should be formed on the same substrate as shown in FIG. 17A. In that case, the analog block 50 is spaced way apart from the digital block 51 to reduce the noise propagated from the digital block 51 through a p-type substrate 52 by increasing the resistance formed by the substrate 52 with a p-well 53. That is to say, an STI region 54 with a large area is defined between the analog and digital blocks 50 and 51.

In an LSI, a sheet resistance of the p-well 53 is normally on the orders of several hundreds to several thousands $\Omega/\square$. Accordingly, by spacing the analog and digital blocks 50 and 51 sufficiently apart from each other, the resistance formed by the p-type substrate 52 with the p-well 53 can be relatively high.

However, when the large-area STI region 54 is defined in a CMP process, the dishing might occur in the region 54 as described above. To avoid this unwanted phenomenon, a dummy diffused layer 55 may be inserted into the STI region 54 as shown in FIGS. 18A and 18B. Then, it is possible to prevent the dishing.

Nevertheless, when another diffused layer and gate electrode have their surfaces turned into silicide alloys, this dummy diffused layer 55 also has its surface silicided. Thus, the dummy diffused layer 55 will have a two-layer structure in which a silicide layer 55b is formed over the remaining, non-alloyed part 55a. As a result, a low-impedance noise propagation path NZb, passing through the silicide layer 55b over the non-alloyed dummy diffused layer 55a, is newly made between the analog and digital blocks 50 and 51.

FIGS. 19A and 19B are circuit diagrams illustrating two models of the inter-block noise propagation path that correspond to the structures shown in FIGS. 17B and 18B, respectively. As shown in FIG. 19A, the structure shown in FIG. 17B has only a noise propagation path NZa, passing through the p-type substrate 52 with the p-well 53, between the analog and digital blocks 50 and 51. And this noise propagation path NZa has a relatively high inter-block resistance R1.

In contrast, the structure shown in FIG. 18B has not only the noise propagation path NZa but also another noise propagation path NZb, passing through the silicide layer 55b over the dummy diffused layer 55a, between the analog and digital blocks 50 and 51 as shown in FIG. 19B. Also, the resistance R1 and another resistance R2, which is lower than the resistance R1, are connected in parallel between the analog and digital blocks 50 and 51. The silicide layer 55b has a sheet resistance of approximately several $\Omega/\square$, whereas the p-well 53 has a sheet resistance of approximately several hundreds to several thousands $\Omega/\square$. Accordingly, the impedance values associated with these members 55b and 53 are different from each other by as much as two to three orders of magnitude.

For that reason, even if the resistance R1 formed by the p-type substrate 52 with the p-well 53 is much increased by spacing the analog and digital blocks 50 and 51 far apart, the impedance between these blocks 50 and 51 decreases considerably. This is because the resistance R2, formed by the backed silicide layer 55b, is connected in parallel between these blocks 50 and 51.

Accordingly, noise, generated by a VSS power supply DVSS for the digital block 51, is propagated to the vicinity of the analog block 50 by way of the silicide layer 55b. Then, the noise passes through the p-type substrate 52 again to affect a VSS power supply AVSS for the analog block 50. As a result, the analog block 50, which is easily affected by noise, possibly operates erroneously or have its characteristics degraded.

The silicided dummy diffused layer does not encourage the noise propagation just in the structure shown in FIG. 18B, but may cause similar noise problems in semiconductor devices with various other structures. For example, noise might also be propagated in a similar manner between a pair of circuit blocks connected together by an n-well or even in a single block.

SUMMARY OF THE INVENTION

It is therefore an object of the present invention to enhance the noise immunity of a semiconductor device, including a dummy diffused layer on a substrate, by preventing the dummy diffused layer from encouraging the noise propagation.

Specifically, an inventive semiconductor device includes: a substrate; a source/drain diffused layer formed in the substrate for a transistor; and a dummy diffused layer formed in the substrate. The source/drain diffused layer has its surface silicided. And the dummy diffused layer has its surface covered with an anti-silicidation film at least partially.

According to the present invention, the dummy diffused layer is covered with the anti-silicidation film, and therefore is not silicided. Thus, part of the substrate with the dummy diffused layer can keep its impedance high. As a result, the noise immunity of the semiconductor device, including the dummy diffused layer, increases.

In one embodiment of the present invention, the anti-silicidation film is preferably an oxide film. Generally speaking, an oxide film is easy to pattern into any desired shape by a normal semiconductor process. Accordingly, the inventive semiconductor device can be fabricated easily in that embodiment.

In another embodiment of the present invention, a dopant, which has been introduced into the source/drain diffused layer, preferably has not been introduced into the dummy diffused layer. In such a case, the resistance of the dummy diffused layer is higher than that of the source/drain diffused layer. As a result, the noise immunity of the device further improves.

Another inventive semiconductor device includes: a substrate; a source/drain diffused layer formed in the substrate for a transistor; and a dummy diffused layer formed in the substrate. The source/drain diffused layer has its surface silicided. The dummy diffused layer has its surface covered with a dummy gate electrode at least partially. The dummy gate electrode has the same structure as a gate electrode for the transistor.

According to the present invention, the dummy diffused layer is covered with the dummy gate electrode, and therefore is not silicided. Thus, part of the substrate with the dummy diffused layer can keep its impedance high. As a result, the noise immunity of the semiconductor device including the dummy diffused layer increases. Furthermore, there is no need to add any extra process step to a normal fabrication process because the dummy gate electrode can be formed along with the normal gate electrode for the transistor.

In this particular embodiment, the dummy diffused layer is preferably located between a circuit block and another circuit block, and the dummy gate electrode is preferably divided into at least two portions disposed between the two circuit blocks. In this embodiment, the dummy gate electrode has at least two separate portions disposed between the two circuit blocks, and therefore noise is much less likely propagated through the dummy gate electrode. As a result, the noise immunity of the device further improves.

In still another embodiment, the dummy gate electrode preferably has a fixed potential level, because the noise will not be propagated through the dummy gate electrode so easily in that situation.

In yet another embodiment, a dopant, which has been introduced into the source/drain diffused layer, preferably has not been introduced into the dummy diffused layer. In such a case, the resistance of the dummy diffused layer is higher than that of the source/drain diffused layer. As a result, the noise immunity of the device further improves.

Still another inventive semiconductor device includes: a substrate; a source/drain diffused layer formed in the substrate for a transistor; and a dummy diffused layer formed in the substrate. The source/drain and dummy diffused layers have their surfaces silicided. A well of a first conductivity type is defined in the substrate. And the dummy diffused layer is formed in the well and a dopant of a second conductivity type, opposite to the first conductivity type, has been introduced into the dummy diffused layer.

According to the present invention, the well of the first conductivity type and the dummy diffused layer, to which a dopant of the second conductivity type has been introduced, together forms a pn junction diode with a depletion-layer capacitance. Thus, in an electrical sense, the silicided surface of the dummy diffused layer is much less transparent to the substrate. As a result, the noise propagation is suppressible.

In one embodiment of the present invention, the dummy diffused layer preferably has a fixed potential level. This is because even if AC noise is propagated through the pn junction diode, the noise is much less likely propagated through the silicided dummy diffused layer.

More particularly, the potential level of the dummy diffused layer is preferably fixed at such a level as applying a reverse bias to a pn junction diode formed by the dummy diffused layer and the well. Then, the semiconductor device can have its noise immunity further increased.

In still another embodiment, the dummy diffused layer may be divided into multiple portions. And those portions of the dummy diffused layer are preferably connected together by silicide diffused layer interconnects that have been formed in the same layer as the dummy diffused layer. In such an embodiment, the potential level of the dummy diffused layer can be fixed at a particular level just by connecting one of those portions of the dummy diffused layer to a metal interconnect. Accordingly, a metal interconnect layer over the dummy diffused layer can be used effectively. That is to say, the wire length can be reduced so that the performance of the device can be enhanced. Also, since a layout for the device can be made efficiently, the eventual device size (i.e., its area on the chip) can be reduced.

Yet another inventive semiconductor device includes: a substrate of a first conductivity type; a source/drain diffused layer, which is formed in the substrate for a transistor and has its surface silicided; and a first well of a second conductivity type, which is formed in the substrate. The second conductivity type is opposite to the first conductivity type. The device further includes: a dummy diffused layer formed in the first well and located between two circuit blocks; and a second well of the first conductivity type, which is formed between the first well and one of the two circuit blocks.

According to the present invention, a pn junction diode is formed around the dummy diffused layer by the substrate of the first conductivity type and the first well of the second conductivity type. If a well of the second conductivity type is defined to be closer to the dummy diffused layer in one of the two circuit blocks, then that well and the second well of the first conductivity type together forms another pn junction diode. Accordingly, even if the upper part of the dummy diffused layer has been silicided, an electrical path, originating from the substrate, should pass a depletion-layer capacitance of the pn junction diode. Thus, the noise is much less likely propagated. As a result, the semiconductor device, including the dummy diffused layer, can have its noise immunity increased.

In one embodiment of the present invention, potential levels of the first and second wells are preferably fixed at such levels as applying a reverse bias to a pn junction diode formed by the first and second wells. Then, the noise immunity of the device further improves.

BRIEF DESCRIPTION OF THE DRAWINGS

FIG. 2 is a flowchart illustrating the detailed processing flow of the anti-silicidation film forming step S20 included in the process illustrated in FIG. 1.

FIGS. 16A through 16G are cross-sectional views illustrating schematic structures corresponding to the semiconductor device fabrication process steps shown in FIG. 15.

DESCRIPTION OF THE PREFERRED EMBODIMENTS

Hereinafter, preferred embodiments of the present invention will be described with reference to the accompanying drawings.

Embodiment 1

A first embodiment of the present invention is characterized by covering the surface of a dummy diffused layer with an anti-silicidation film to prevent the surface from being silicided.

Figure 1:
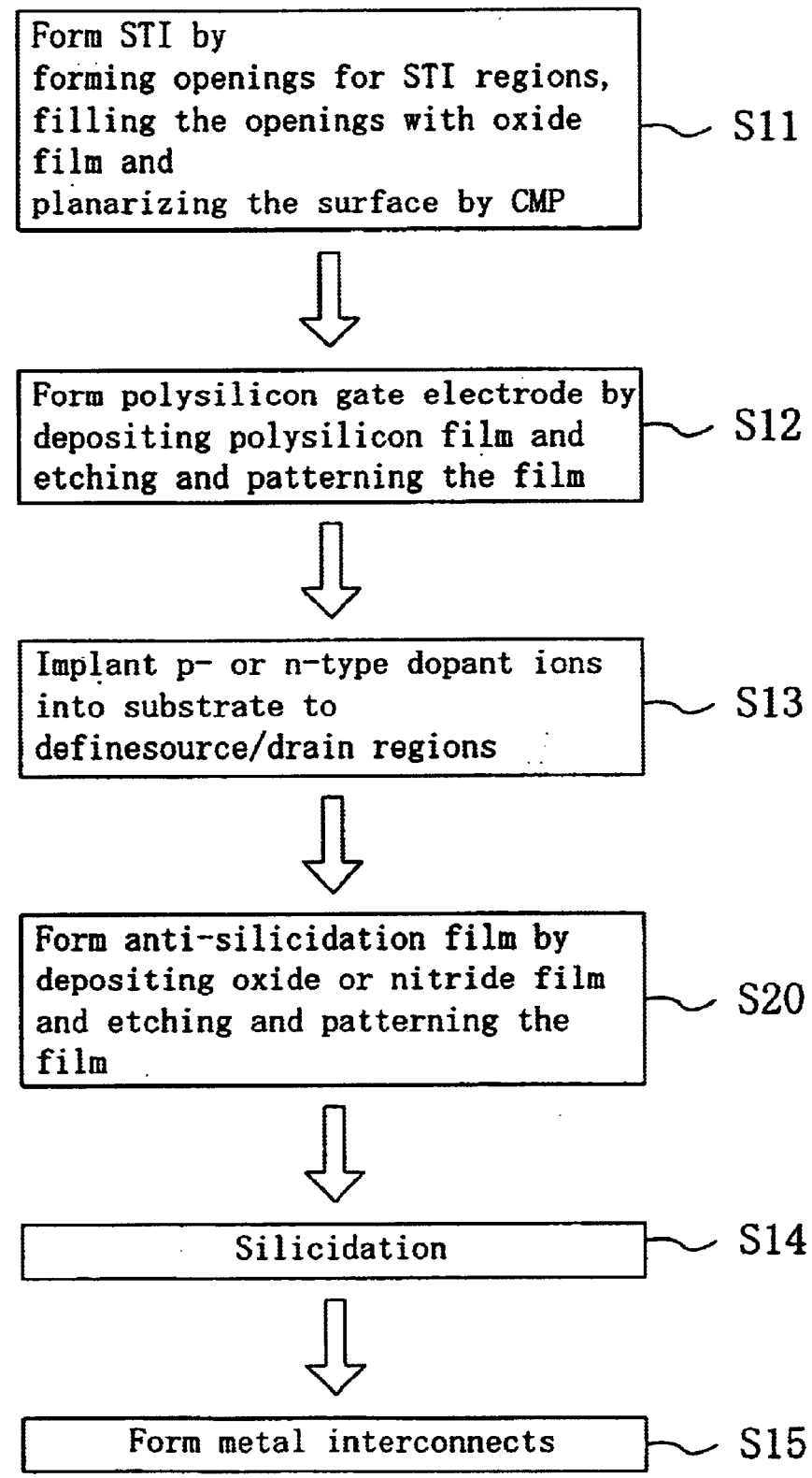
FIG. 1 is a flowchart illustrating respective process steps for fabricating a semiconductor device according to a first embodiment of the present invention.

FIG. 1 illustrates respective process steps for fabricating a semiconductor device according to the first embodiment. In this embodiment, first, the steps S11, S12 and S13 of defining STI regions, forming a gate electrode and implanting dopant ions into the substrate to define source/drain regions, respectively, are performed as in the known process. Then, before the silicidation step S14 is carried out, the step S20 of forming an anti-silicidation film is performed.

Figure 17A:
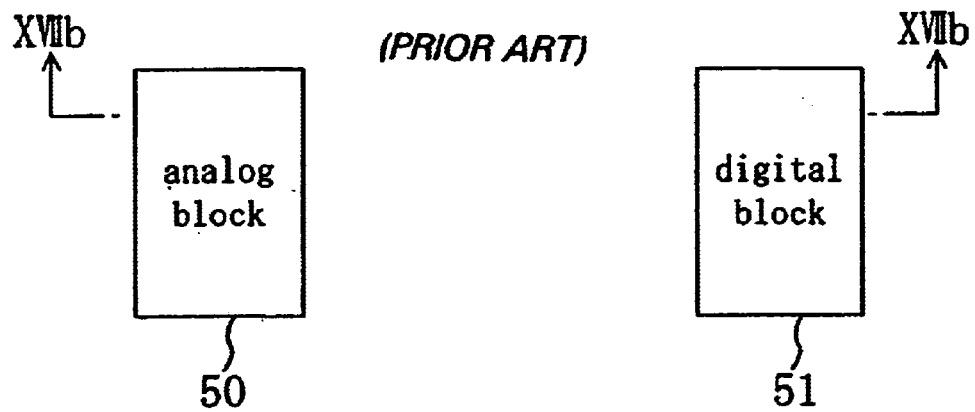
FIGS. 17A and 17B are respectively a plan view and a cross-sectional view illustrating a structure for a known semiconductor device in which analog and digital blocks are integrated on the same substrate.
Figure 17B:
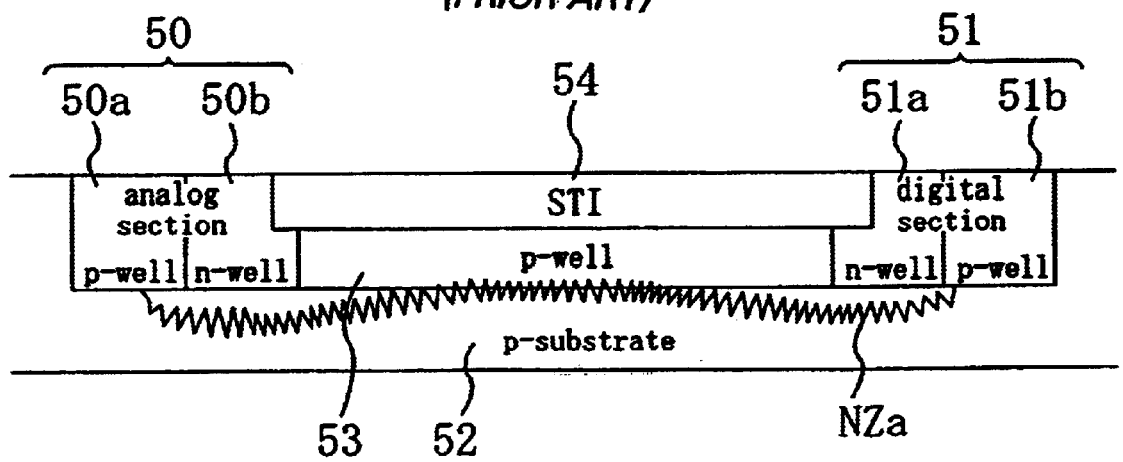
Figure 18A:
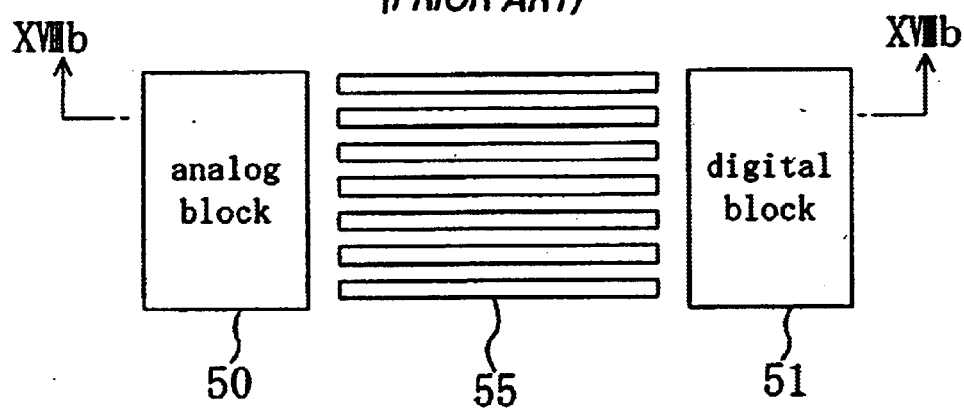
FIGS. 18A and 18B are respectively a plan view and a cross-sectional view illustrating an alternative structure, including a dummy diffused layer between the blocks, for the device shown in FIGS. 17A and 17B.
Figure 18B:
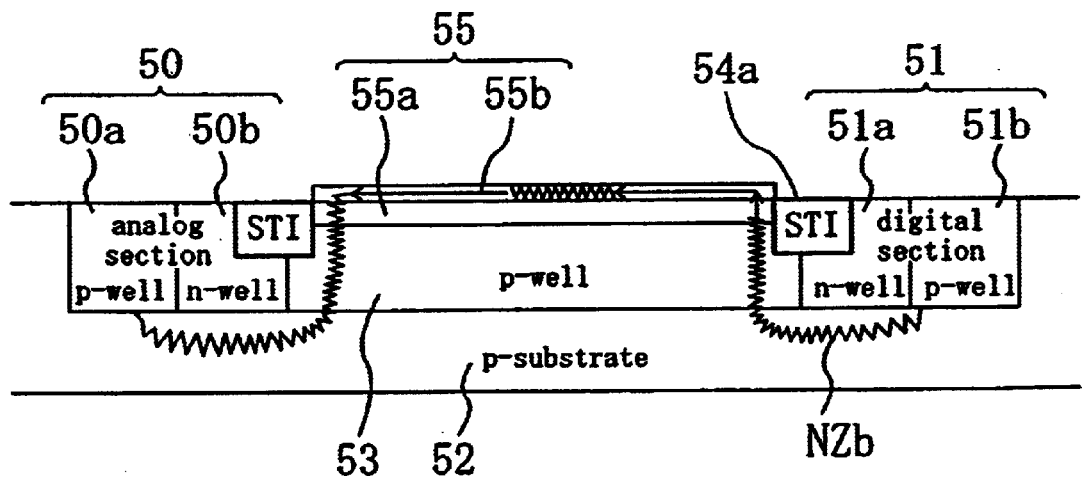
Figure 19A:
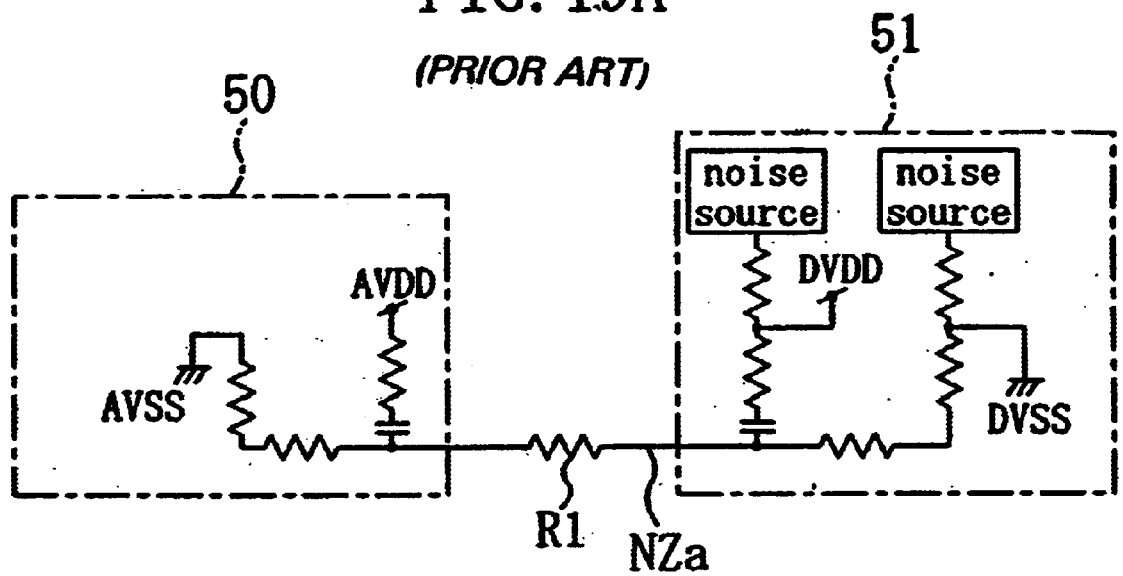
FIGS. 19A and 19B are circuit diagrams illustrating two inter-block noise propagation path models.
Figure 19B:
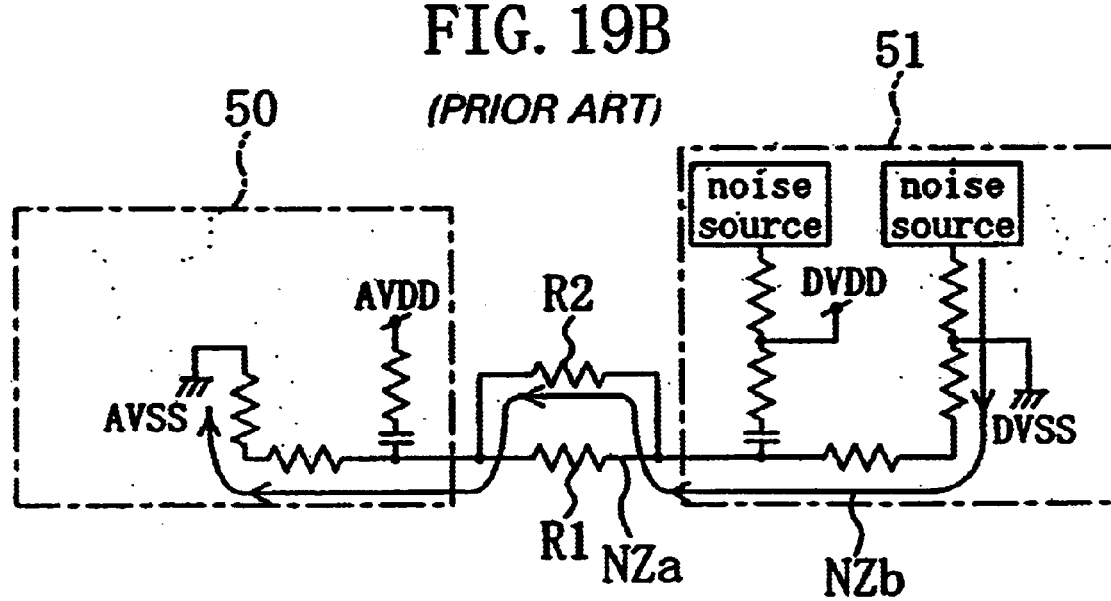

In the illustrated embodiment, the analog and digital blocks 50 and 51 are provided for the semiconductor device as shown in FIGS. 17A and 17B. Also, a twin well structure is adopted. Specifically, the device is designed to define an n-well in the surface region of a p-type substrate and then define a p-well by reversing the conductivity type of part of the n-well. As a result, the p-well is defined between the analog and digital blocks 50 and 51 as shown in FIG. 17B. Furthermore, to prevent the dishing phenomenon from occurring in a CMP process, a dummy diffused layer is formed between the analog and digital blocks 50 and 51 to meet a predetermined design rule.

Suppose the specifications of the analog block 50 require so high precision that noise, which is produced from the digital block 51 to affect the analog block 50, should be as small as possible.

FIG. 2 is a flowchart illustrating the detailed processing flow of the step S20 of forming an anti-silicidation film. As shown in FIG. 2, first, in Step S21, a film to be patterned into an anti-silicidation film is deposited over the entire surface of the substrate. Next, in Step S22, the surface of the film is coated with a resist film. Then, a masking pattern is defined in Step S23 to cover respective regions where the anti-silicidation film should exist, and the resist film is exposed to some type of radiation in Step S24, thereby etching the film away except those masked regions in Step S25. In this manner, the anti-silicidation film is formed. In the illustrated embodiment, the anti-silicidation film is formed with the masking pattern defined to cover the surface of the dummy diffused layer entirely.

After the anti-silicidation film has been formed this way, the silicidation step S14 is performed. Accordingly, that part covered with the anti-silicidation film, or the surface of the dummy diffused layer, is not silicided. On the other hand, the other parts not covered with the anti-silicidation film, i.e., the surface of a diffused layer to be used as node electrodes for a transistor and the surface of the gate electrode, are silicided, because silicon is exposed on those surfaces. In this manner, the silicide layer can be selectively formed only in desired regions.

Figure 3A:
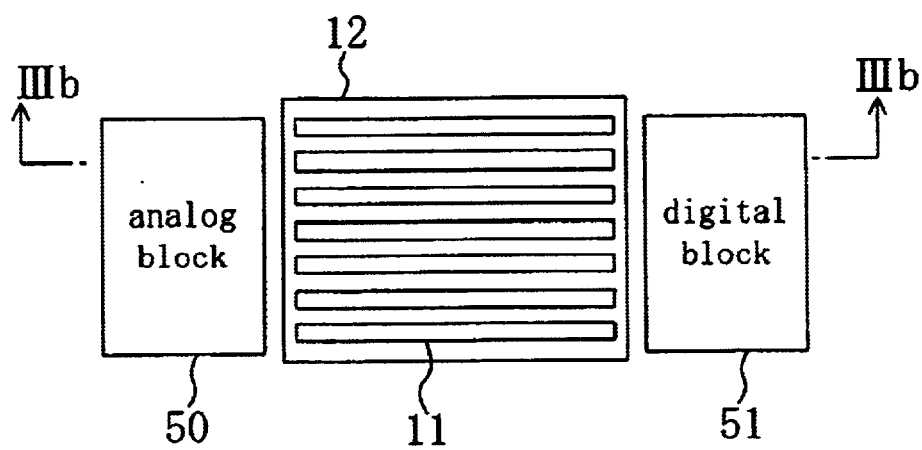
FIGS. 3A and 3B are respectively a plan view and a cross-sectional view illustrating a structure for the semiconductor device of the first embodiment.
Figure 3B:
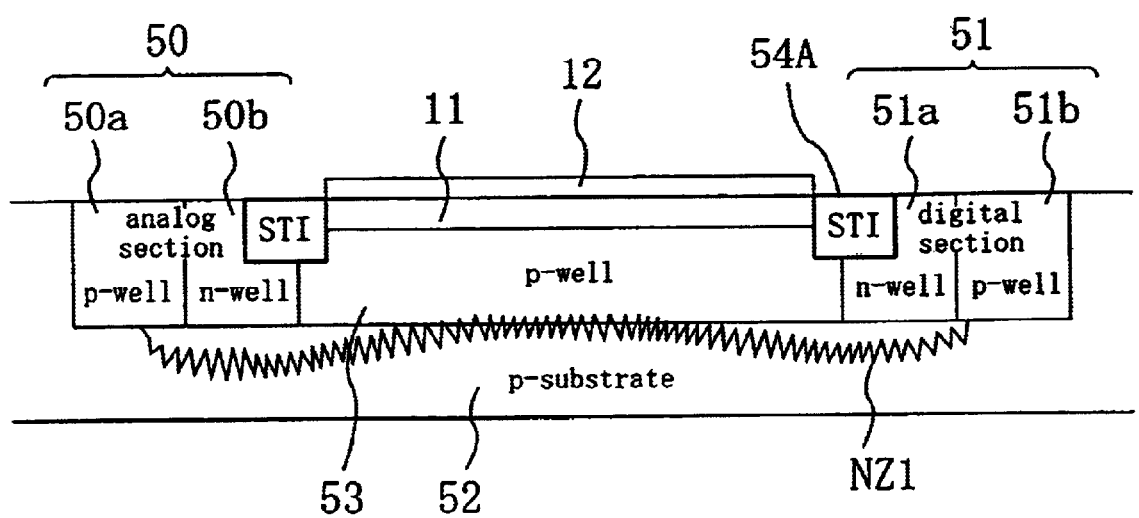

FIGS. 3A and 3B are respectively a plan view, and a cross-sectional view taken along the line IIIb—IIIb shown in FIG. 3A, illustrating a structure for a semiconductor device fabricated by the process of the first embodiment. As shown in FIG. 3B, the analog block 50 includes p- and n-wells 50a and 50b as a source/drain diffused layer for a transistor, while the digital block 51 also includes n- and p-wells 51a and 51b as another source/drain layer for another transistor.

As shown in FIGS. 3A and 3B, the dummy diffused layer 11, formed between the analog and digital blocks 50 and 51, has its surface covered with the anti-silicidation film 12 and has not been silicided. Accordingly, the backed silicide resistor, which is formed by siliciding the dummy diffused layer 55b in the known device, does not exist between the analog and digital blocks 50 and 51 of the inventive device. As a result, the inter-block impedance can be kept high. That is to say, this embodiment provides an effective countermeasure against the noise possibly propagated between the analog and digital blocks 50 and 51.

The anti-silicidation film 12 is preferably an oxide film, because an oxide film 12 can be formed or shaped easily. Alternatively, the film 12 may also be a nitride film.

Generally speaking, the step of forming an anti-silicidation film is often prepared for a normal silicidation process to provide an analog resistor or a resistor for realizing electrostatic discharge (ESD) protection. In that case, the process step of forming the anti-silicidation film to increase the noise immunity according to this embodiment may be performed along with the prepared process step. Thus, this embodiment is implementable without newly adding any process step.

It should be noted that when dopant ions are implanted into parts of the substrate to be source/drain regions or pocket doped regions, no ions may be implanted into the dummy diffused layer 11.

Should a p-type dopant have been introduced into the dummy diffused layer 11 formed over the p-well 53 in the step S13 of defining source/drain regions by ion implantation, the dummy diffused layer 11 will have a sheet resistance lower than that of the p-well 53. In such a situation, even though silicidation is avoidable due to the existence of the anti-silicidation film 12, the dummy diffused layer 11 much more likely propagates the noise. Accordingly, where no ions are implanted into the dummy diffused layer 11 in the step S13, the sheet resistance of the dummy diffused layer 11 can be kept high enough, thus increasing the inter-block impedance. As a result, the noise propagation can be further suppressed.

The surface of the dummy diffused layer 11 does not have to be covered with the anti-silicidation film entirely but just partially. This is because those covered portions are not silicided and the noise propagation still can be suppressed sufficiently.

Embodiment 2

A second embodiment of the present invention is characterized by covering the surface of a dummy diffused layer with a dummy gate electrode, having the same structure as the gate electrode of a transistor, to prevent the surface of the dummy diffused layer from being silicided. That is to say, the fabrication process of the second embodiment does not include the step S20 of forming an anti-silicidation film unlike the first embodiment. Instead, in the step S12 of forming a gate electrode, a dummy gate electrode, covering the dummy diffused layer, is formed along with a gate electrode for a transistor.

Figure 4A:
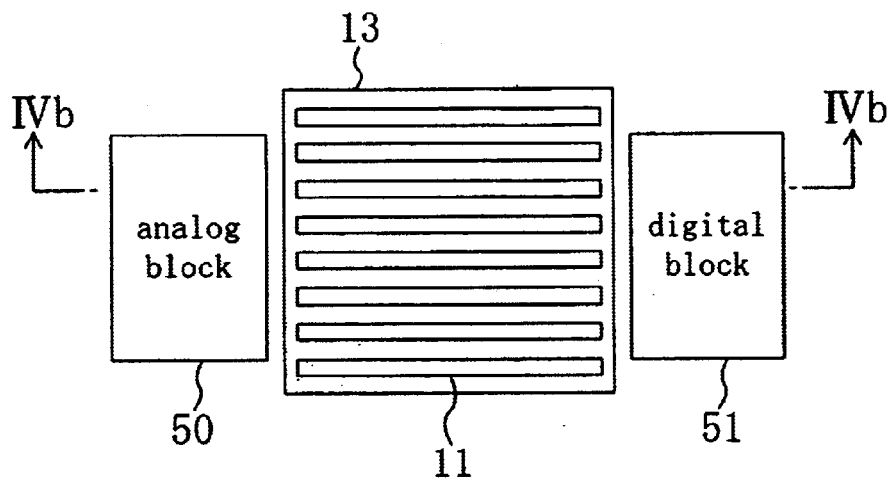
FIGS. 4A and 4B are respectively a plan view and a cross-sectional view illustrating a structure for a semiconductor device according to a second embodiment of the present invention.
Figure 4B:
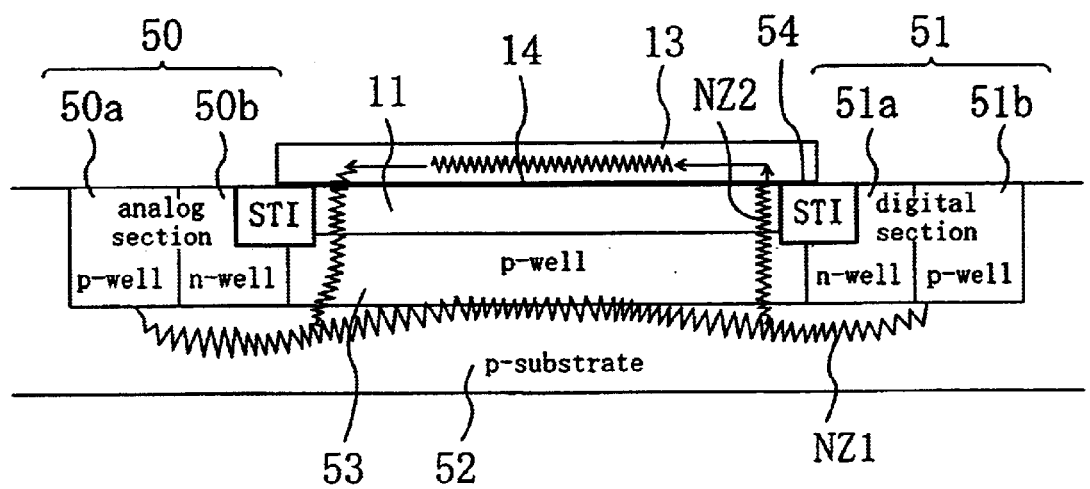

FIGS. 4A and 4B are respectively a plan view, and a cross-sectional view taken along the line IVb—IVb shown in FIG. 4A, illustrating a structure for a semiconductor device according to the second embodiment. As shown in FIGS. 4A and 4B, a polysilicon gate electrode 13 has been formed as a dummy gate electrode to cover the surface of a dummy diffused layer 11. In such a structure, the dummy gate electrode 13, formed over the dummy diffused layer 11, is silicided in the silicidation step S14. Accordingly, the dummy diffused layer 11 itself is not silicided. Also, a gate oxide film 14 is interposed between the dummy diffused layer 11 and dummy gate electrode 13.

The dummy gate electrode 13 and the gate electrode for a transistor can be formed at a time. Accordingly, this embodiment is implementable without newly adding any extra process step. In the step S13 of forming the gate electrodes, the dummy gate electrode 13 should preferably be formed to afford a sufficient overlay margin, because some error is inevitable when a diffused layer mask and a gate electrode mask are overlaid on, and aligned with, each other.

Also, where the dummy gate electrode is formed as a countermeasure against noise as is done in this embodiment, the percentage of a chip area actually covered by the gate electrodes might be different from the originally designed one. This is because the designer of the device normally does not expect the addition of the dummy gate electrode. The gate area percentage is one of critical factors determining the resultant characteristic of a semiconductor device. Accordingly, if the difference in gate area percentage seriously affects the characteristic of the device, then the anti-silicidation film of the first embodiment is preferred to the dummy gate electrode of the second embodiment.

The surface of the dummy diffused layer 11 does not have to be covered with the dummy gate electrode 13 entirely but just partially. This is because those covered parts are not silicided and the noise propagation still can be suppressed sufficiently.

Modified Example of Embodiment 2

As shown in FIG. 4B, the dummy diffused layer 11 is not silicided due to the existence of the dummy gate electrode 13 covering the dummy diffused layer 11. For that reason, the noise propagation path, passing through the silicided dummy diffused layer 55b as described for the background, cannot exist.

In this case, however, another type of noise propagation path NZ2 might exist. Specifically, a coupling capacitor is formed by the dummy diffused layer 11, gate oxide film 14 and dummy gate electrode 13 to pass noise from the digital block 51 to the dummy gate electrode 13. The dummy gate electrode 13 is a silicided low resistor and is also a floating node with no fixed potential level. Accordingly, the noise is propagated to the vicinity of the analog block 50. Another coupling capacitor is formed by the dummy diffused layer 11, gate oxide film 14 and dummy gate electrode 13 around the analog block 50. As a result, the noise is eventually propagated to the p-type substrate 52 to reach the analog block 50.

By ameliorating the second embodiment, this modified example cuts this additional noise propagation path NZ2 off.

Figure 5A:
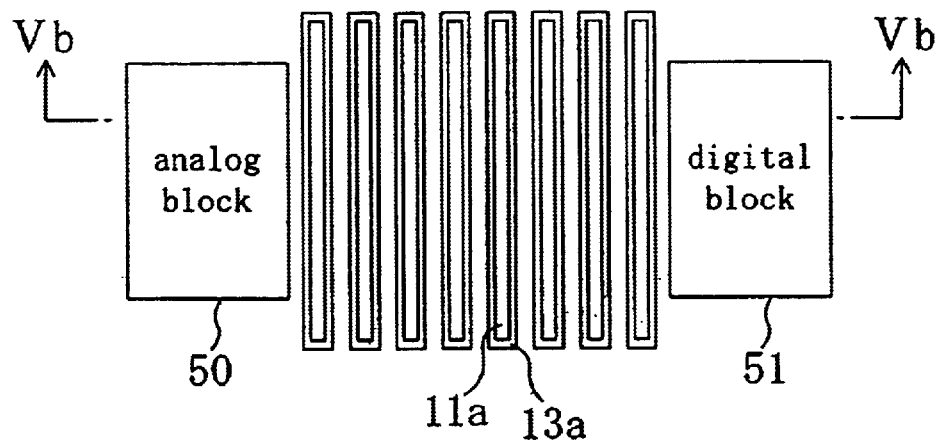
FIGS. 5A and 5B are respectively a plan view and a cross-sectional view illustrating a structure for a semiconductor device according to a modified example of the second embodiment.
Figure 5B:
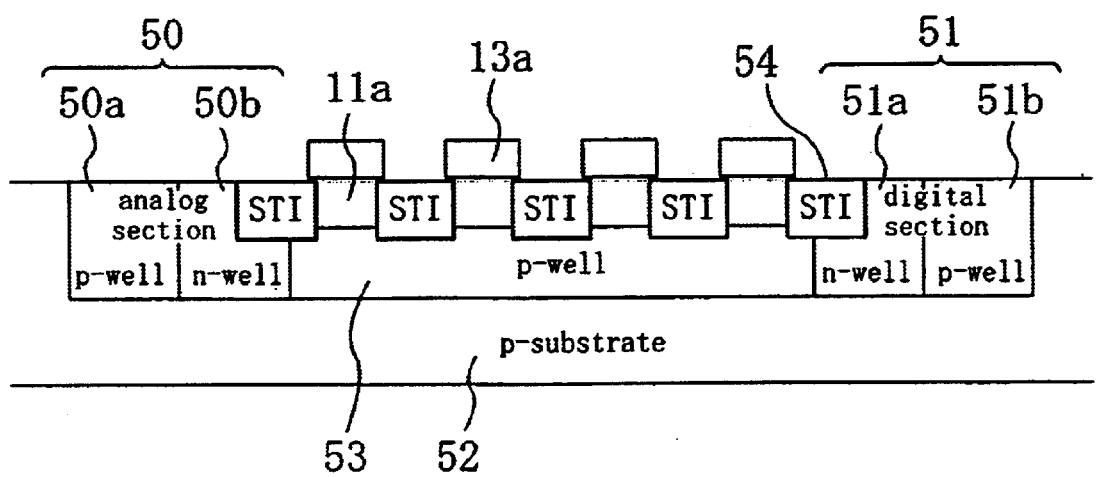

FIGS. 5A and 5B are respectively a plan view, and a cross-sectional view taken along the line Vb—Vb shown in FIG. 5A, illustrating a structure for a semiconductor device according to a modified example of the second embodiment. As shown in FIGS. 5A and 5B, the dummy diffused layer 11 has been divided into a number of parts 11a along a path running from the digital block 51 (i.e., a noise source block) toward the analog block 50 that should not be affected by the noise. The dummy gate electrode 13 has also been divided into the same number of parts 13a covering the associated parts 11a of the dummy diffused layer 11. That is to say, as can be seen from FIGS. 5A and 5B, the dummy gate electrode 13 exists intermittently between the analog and digital blocks 50 and 51 (which are equivalent to two circuit blocks as defined in the claims). Accordingly, the noise propagation path NZ2 shown in FIG. 4B is not made anymore.

The effects of this modified example are also attainable by dividing only the dummy gate electrode 13, not the dummy diffused layer 11.

In actually laying out circuit components on a chip, this countermeasure should be taken two-dimensionally for surrounding blocks.

Figure 6A:
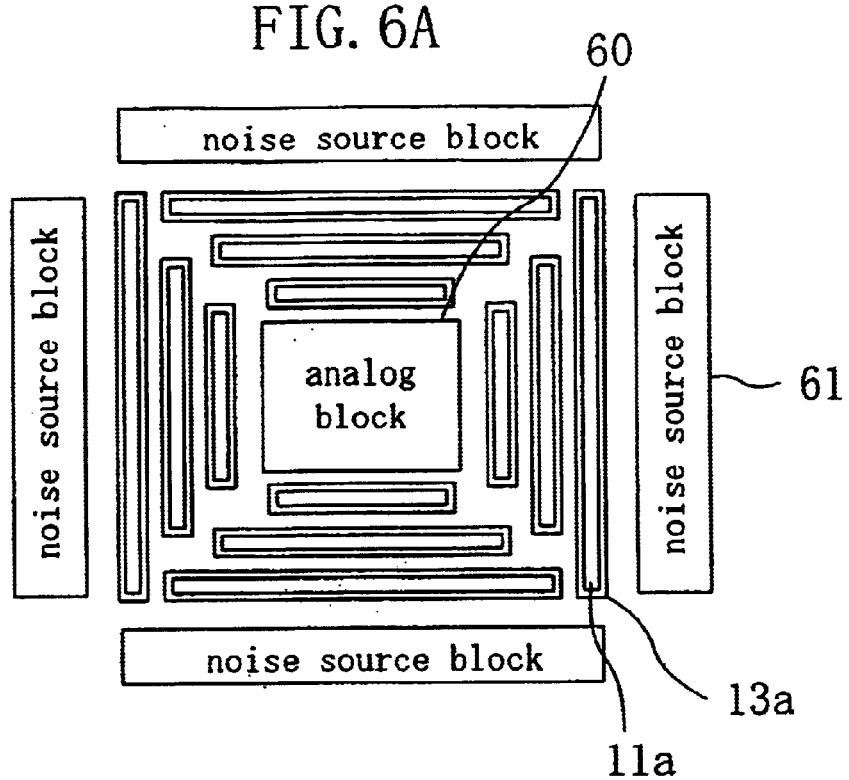
FIGS. 6A and 6B are plan views illustrating exemplary chip layouts according to the second embodiment.
Figure 6B:
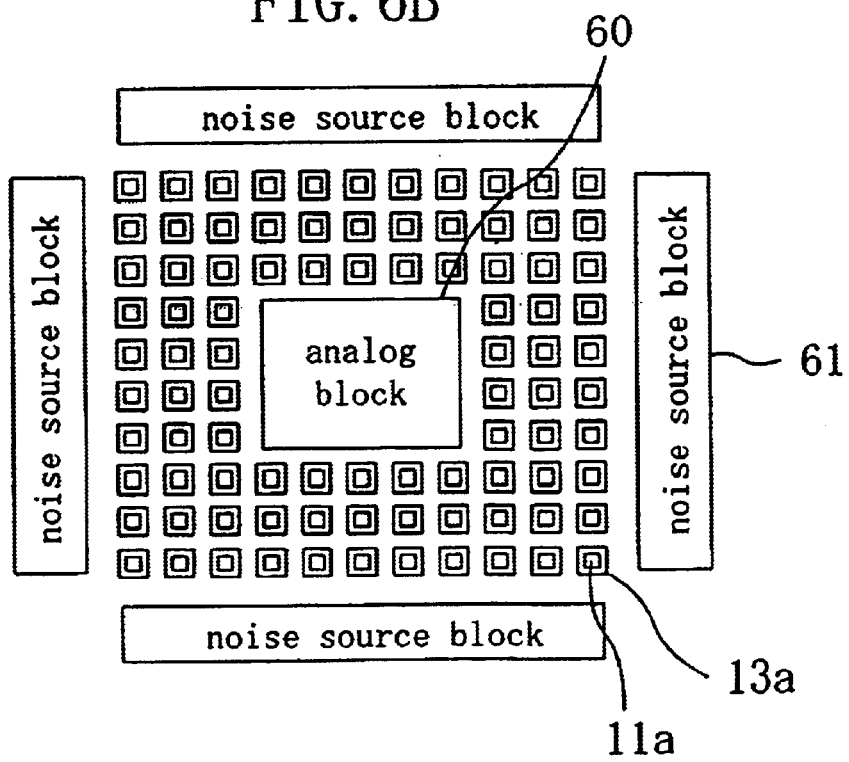

In the example illustrated in FIG. 6A, those divided parts 11a of the dummy diffused layer 11 are arranged in lines between an analog block 60 and respective noise source blocks 61. As shown in FIG. 6A, each set of parts 11a extends vertically to an associated path between the analog block 60 and associated one of the noise source blocks 61. In the example illustrated in FIG. 6B on the other hand, square or polygonal parts 11a of the dummy diffused layer 11 are arranged in columns and rows to form an array. In inserting an additional pattern into a device being designed manually, the linear pattern shown in FIG. 6A is preferred, because this patterns is much simpler and requires a far less data quantity. However, where a pattern should be inserted automatically using some CAD tool for the physical layout process, the regular array pattern shown in FIG. 6B is easier to add.

For the second embodiment of the present invention, the gate electrodes are made of polysilicon and the gate electrodes and the diffused layer are both silicided in the step S14. Alternatively, the gate electrodes may be made of any other non-silicidable material, e.g., polycide or poly-metal. In that case, only the diffused layer is silicided but the gate electrodes are not in the silicidation process step. However, the dummy diffused layer is not silicided, either, because the dummy gate electrode exists.

Embodiment 3

Figure 7A:
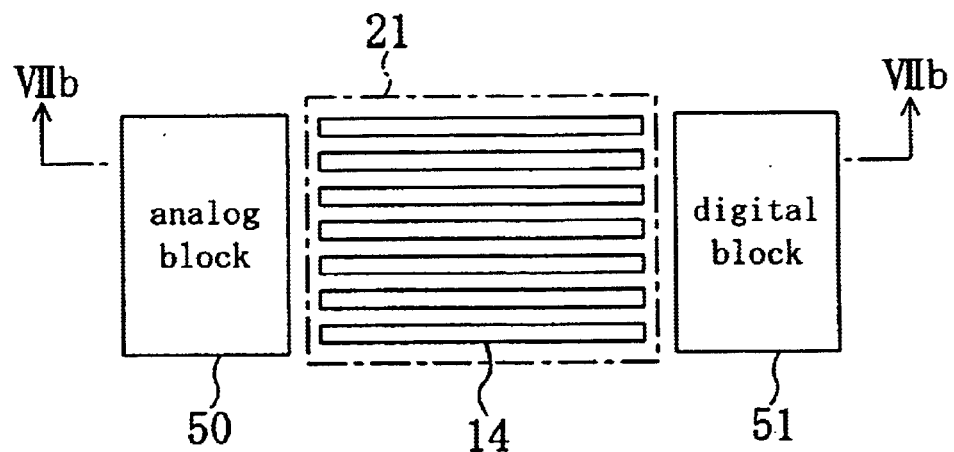
FIGS. 7A and 7B are respectively a plan view and a cross-sectional view illustrating a structure for a semiconductor device according to a third embodiment of the present invention.
Figure 7B:
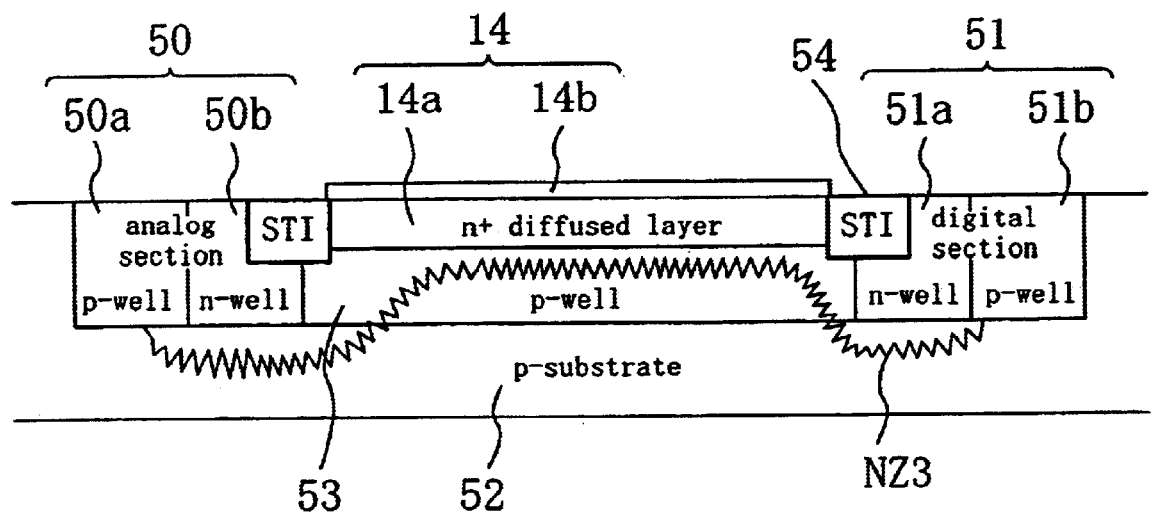

FIGS. 7A and 7B are respectively a plan view, and a cross-sectional view taken along the line VIIb—VIIb shown in FIG. 7A, illustrating a structure for a semiconductor device according to a third embodiment of the present invention. As shown in FIGS. 7A and 7B, a dummy diffused layer 14 is made up of a non-silicided silicon layer 14a and a silicided layer 14b. An n-type dopant has been introduced into the silicon layer 14a by an ion implantation process. That is to say, the n-type (e.g., a second conductivity type) dopant has been introduced into the dummy diffused layer 14 that was formed over a p-type (e.g., a first conductivity type) well 53. The dopant ions may be implanted into the dummy diffused layer 14 by using an n-type dopant ion implantation mask 21 as shown in FIG. 7A.

If the n-type dopant has been introduced this way into the dummy diffused layer 14 over the p-well 53, then the n-type doped silicon layer 14a is formed under the silicided layer 14b resulting from the subsequent silicidation (or alloy) process. And a pn junction diode is formed by the p-well 53 and n-type doped silicon layer 14a.

Figure 8:
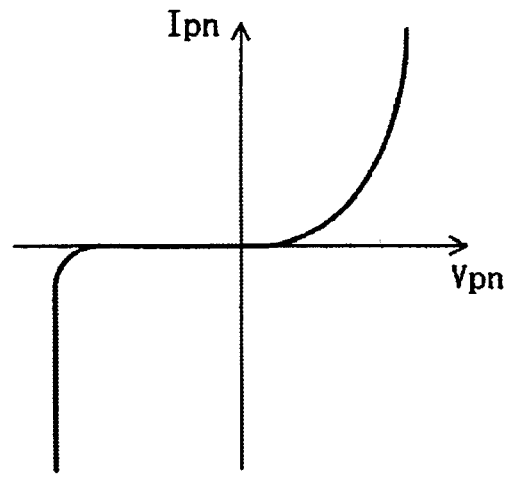
FIG. 8 is a graph illustrating a voltage-current characteristic of a diode.

FIG. 8 is a graph illustrating the voltage-current characteristic of the diode. As shown in FIG. 8, even when a voltage Vpn is applied to the diode, almost no current Ipn flows and the diode behaves like a capacitor around the origin of this graph. In fact, the pn diode actually formed has a structure similar to a capacitor including a depletion layer as its insulator. And this pn diode exists on a path leading to the silicided layer 14b as the upper part of the dummy diffused layer 14. Accordingly, a noise propagation path passing through the silicided layer 14b is much less transparent to the digital block 51, i.e., the noise source, and to the p-type substrate 52 and p-well 53 adjacent to the block 51. Thus, even if the dummy diffused layer 14 has been partially silicided, it is still possible to prevent the noise from being propagated through the dummy diffused layer 14 by introducing a dopant of n-type, opposite to that of the p-well 53, into the dummy diffused layer 14.

Figure 9:
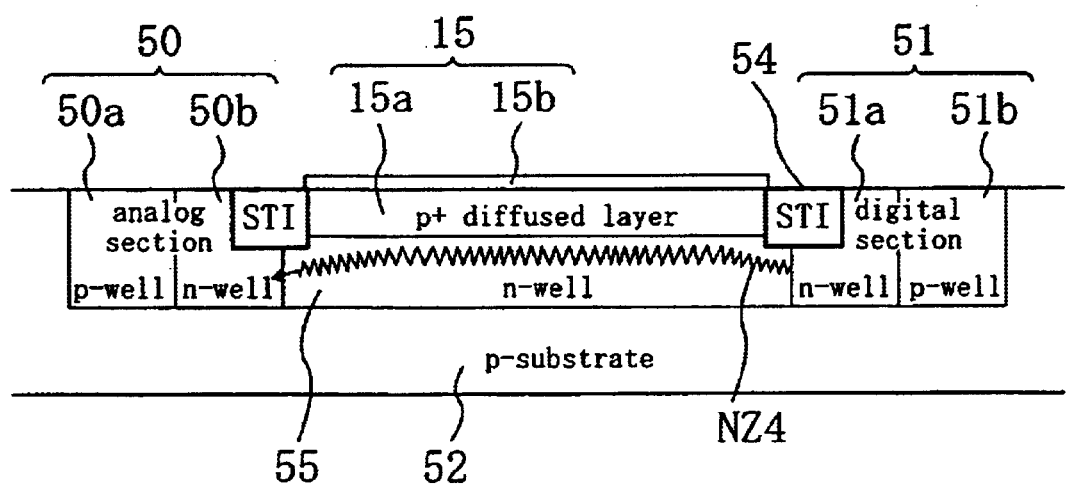
FIG. 9 is a cross-sectional view illustrating a structure for a semiconductor device according to a modified example of the third embodiment.

Also, where a dummy diffused layer 15 has been formed over an n-well 55 as shown in FIG. 9, a pn junction diode can also be formed in a similar manner by introducing a p-type dopant into the dummy diffused layer 15. Accordingly, even if the dummy diffused layer 15 has been partially silicided, no noise will be propagated, either, by way of that dummy diffused layer 15.

The process step of implanting dopant ions into the dummy diffused layer may be performed as an additional process step if necessary. However, it is more preferable to carry out this process step along with the process step of implanting dopant ions into the substrate to define source/drain regions for a transistor. This is because this embodiment is implementable without newly adding any extra process step, and that would be more cost effective.

Optionally, the third embodiment may be combined with the first embodiment. That is to say, a dopant may be introduced into the dummy diffused layer first, and then the anti-silicidation film may be formed thereon. Alternatively, the third embodiment is combinable with the second embodiment. In that case, however, the process step of implanting dopant ions into the dummy diffused layer should be performed separately from the process step of implanting dopant ions to define source/drain regions for a transistor. The reason is as follows. Specifically, source/drain regions for a transistor are normally defined by dopant ion implantation after a gate electrode has been formed. Accordingly, even if the dopant is tentatively introduced into the dummy diffused layer when the dopant is introduced to define the source/drain regions, the dopant is blocked by the dummy gate electrode and cannot reach the dummy diffused layer. For that reason, where the third and second embodiments are combined, the dopant should be introduced into the dummy diffused layer before the gate electrode is formed.

Embodiment 4

Figure 10A:
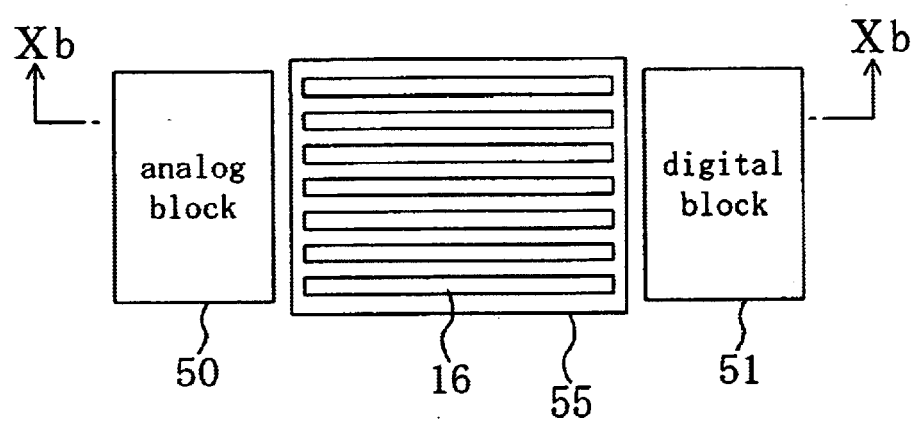
FIGS. 10A and 10B are respectively a plan view and a cross-sectional view illustrating a structure for a semiconductor device according to a fourth embodiment of the present invention.
Figure 10B:
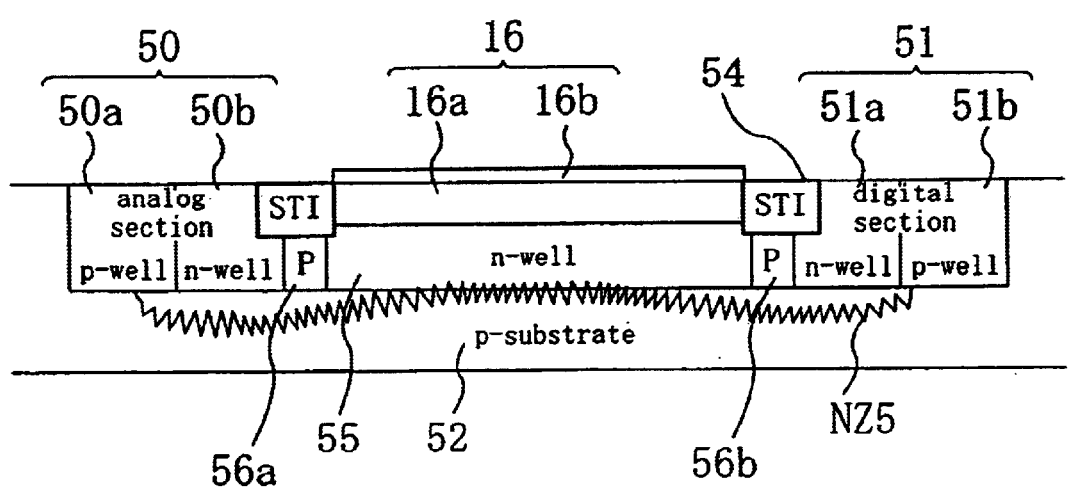

FIGS. 10A and 10B are respectively a plan view, and a cross-sectional view taken along the line Xb—Xb shown in FIG. 10A, illustrating a structure for a semiconductor device according to a fourth embodiment of the present invention.

As shown in FIG. 10B, a dummy diffused layer 16 is surrounded by an n-well 55 (i.e., a first well of a second conductivity type). To suppress the noise propagation, another pair of wells of a first conductivity type, or p-wells 56a and 56b, are additionally provided between the n-well 55 and the n-well 50b of the analog block 50 and between the n-well 55 and the n-well 51a of the digital block 51, respectively. In the analog and digital blocks 50 and 51, each well 50b or 51a, located closer to the dummy diffused layer 16, is of n-type. Accordingly, to block the noise propagation, the p-wells 56a and 56b are inserted between the n-well 55, including the dummy diffused layer 16, and the surrounding blocks 50 and 51.

In such a structure, a pn junction diode is formed by the p-type substrate 52 and n-well 55 at the bottom of the region between the dummy diffused layer 16 and p-type substrate 52. In addition, two more pn junction diodes are formed by the p-wells 56a and 56b and n-well 55 at the right- and left-hand ends of that region. That is to say, these three pn junction diodes together forms a "receptacle" for the dummy diffused layer 16.

As already described for the third embodiment, each of the pn junction diodes thus formed blocks the noise propagation between the regions adjacent to the diode. Accordingly, even if the dummy diffused layer 16 is silicided, the noise propagation path, passing through the silicided layer 16b as the upper part of the dummy diffused layer 16, is much less transparent to the digital block 51 (i.e., the noise source) or the p-type substrate 52 adjacent to the digital block 51.

As can be seen, according to the fourth embodiment, the dummy diffused layer 16 is provided to eliminate the dishing phenomenon from a CMP process, and yet no noise will be propagated through the dummy diffused layer 16.

It should be noted that if the well, closer to the dummy diffused layer 16, is of p-type in each of the surrounding blocks 50 and 51, there is no need to insert the p-wells 56a and 56b between the n-well 55 and the blocks 50 and 51.

Embodiment 5

Figure 11:
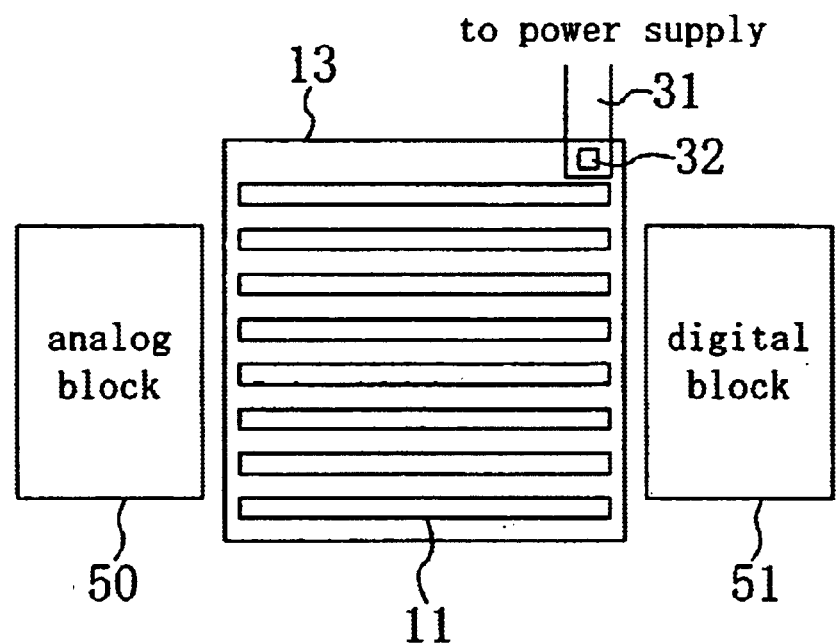
FIG. 11 is a plan view illustrating a structure for a semiconductor device according to a fifth embodiment of the present invention.

FIG. 11 is a plan view illustrating a structure for a semiconductor device according to a fifth embodiment of the present invention. The device of the fifth embodiment is a modification to the device of the second embodiment shown in FIGS. 4A and 4B. As shown in FIG. 11, the dummy gate electrode 13, covering the dummy diffused layer 11, is connected to a metal interconnect 31 via a contact 32, and has its potential level fixed at either supply voltage level or ground level.

As already described for the second embodiment, when the dummy gate electrode 13 is formed to cover the surface of the dummy diffused layer 11 as shown in FIGS. 4A and 4B, the dummy diffused layer 11 is not be silicided. However, the dummy gate electrode 13 is a silicided low resistor and is also a floating node with no fixed potential level. Accordingly, noise might be propagated through a coupling capacitor formed by the dummy diffused layer 11, gate oxide film 14 and dummy gate electrode 13.

Generally speaking, any capacitor, including an insulator sandwiched between two conductors, becomes a signal-transmitting conductor responsive to an AC signal, in particular. That is to say, the following equation $$Q = C \cdot V$$
$$\therefore dQ/dt = I = C \cdot dV/dt$$

tells us that where the voltage V is variable with time, the greater the capacitance C, the larger the amount of current I flowing.

Thus, according to the fifth embodiment, the dummy gate electrode 13 has its potential level fixed at either supply voltage level or ground level to be supplied through the metal interconnect 31 as shown in FIG. 11. In this manner, the capacitor, consisting of the diffused layer, oxide film and gate electrode, can have one of its electrodes fixed at a potential level. As a result, the propagation of noise, or AC signal, in particular, between the analog and digital blocks 50 and 51 is suppressible. Consequently, the noise immunity of the semiconductor device improves.

Embodiment 6

Figure 12:
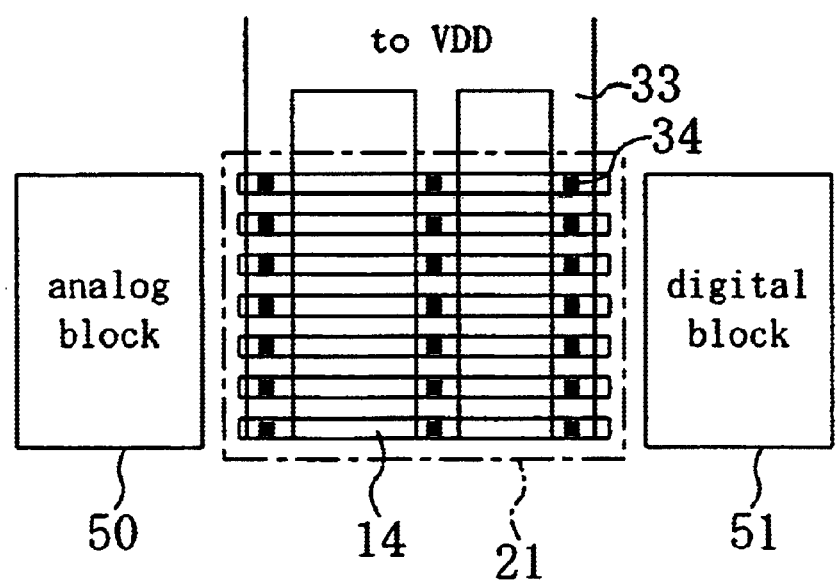
FIG. 12 is a plan view illustrating a structure for a semiconductor device according to a sixth embodiment of the present invention.

FIG. 12 is a plan view illustrating a structure for a semiconductor device according to a sixth embodiment of the present invention. The device of the sixth embodiment is a modification to the device of the third embodiment shown in FIGS. 7A and 7B. As shown in FIG. 12, the dummy diffused layer 14, including the silicided upper part 14b, is connected to metal interconnects 33 via contacts 34, and has its potential level fixed at a supply voltage level VDD.

As described for the third embodiment, the n-type dopant is introduced into the dummy diffused layer 14 over the p-well 53 to form a pn junction diode between the p-well 53 and n-type doped silicon layer 14a as shown in FIG. 7B. Thus, even if the dummy diffused layer 14 is partially silicided, a noise propagation path, passing through the silicided layer 14b, is much less transparent to the digital block 51 (i.e., the noise source) and to the p-type substrate 52 and p-well 53 adjacent to the digital block 51.

In the sixth embodiment, the n-type doped dummy diffused layer 14 has its potential level fixed so that the pn junction diode, formed by the p-well 53 and dummy diffused layer 14, is reverse biased. In the example illustrated in FIG. 12, the dummy diffused layer 14 is connected via the contacts 34 and metal interconnects 33 to a VDD power supply. As a result, the dummy diffused layer 14 has its potential level fixed at the supply voltage level and a reverse bias is applied to the pn junction diode formed by the p-well 53 and dummy diffused layer 14. Consequently, the noise immunity of the semiconductor device further improves compared to the third embodiment.

Following is the supplementary reason why the noise immunity improves when a reverse bias is applied to the pn junction diode.

In general, when a reverse bias is applied to a pn diode, a depletion layer expands around the pn junction. For a capacitor including two conductors and one insulator sandwiched between them, the expansion of the depletion layer means that the insulator thickens to increase the distance between the two conductors.

As is well known from the following equation $C = \epsilon \times S \text{ (area of conductor)}/d \text{(thickness of insulator)}$ the capacitance decreases as the depletion layer expands.

Accordingly, as can be seen from the equation cited for the fifth embodiment, $Q = C \cdot V$ $\therefore dQ/dt = I = C \cdot dV/dt$ even if the voltage variation dV/dt is the same, the noise I to be propagated is in proportion to the capacitance C. Thus, as the depletion layer thickens, the noise propagated decreases.

This is why the noise immunity further improves if a voltage is applied as is done in the sixth embodiment so that the pn diode, formed by the well and dummy diffused layer, is reverse biased. The same approach is also applicable to a situation where a p-type doped dummy diffused layer is formed in an n-well. In that case, the dummy diffused layer should be connected to a ground line VSS so that the resultant pn diode is reverse biased.

Figure 13:
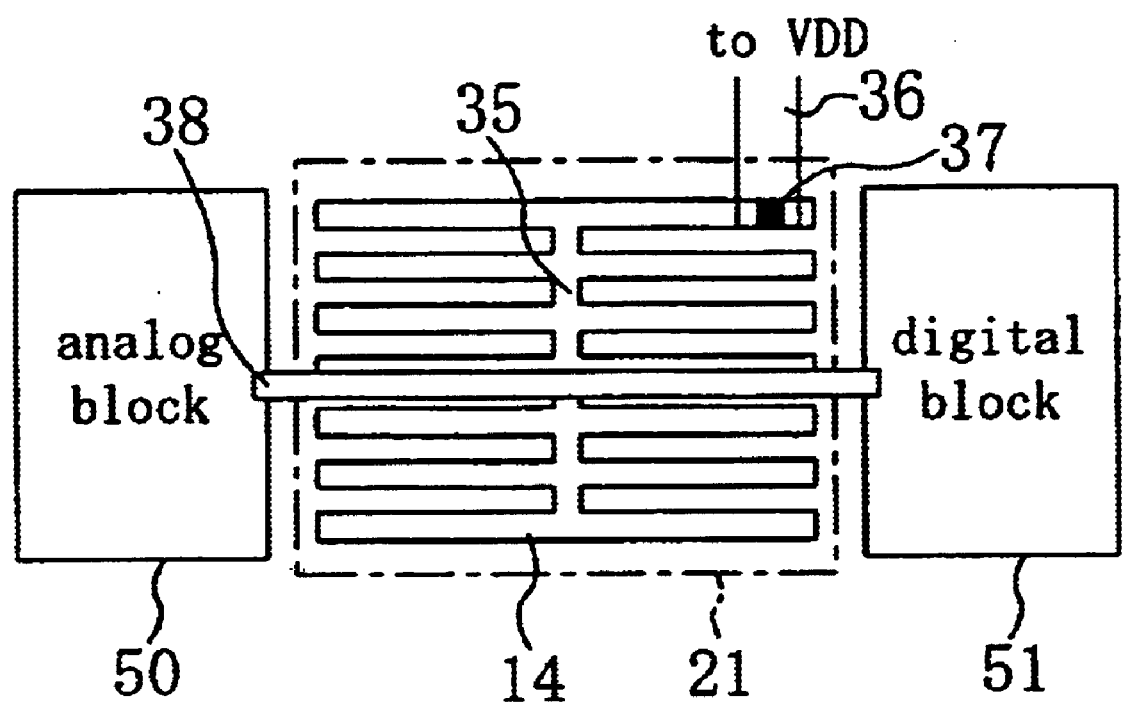
FIG. 13 is a plan view illustrating a structure for another semiconductor device according to the sixth embodiment.

FIG. 13 is a plan view illustrating a structure for another semiconductor device according to the sixth embodiment. In the structure illustrated in FIG. 13, the dummy diffused layer 14 is divided into multiple portions, which are connected together via a diffused layer interconnect 35. The diffused layer interconnect 35 also functions as a dummy diffused layer by itself. Furthermore, the diffused layer interconnect 35 is also silicided along with the dummy diffused layer 14 in the silicidation process step. Accordingly, the sheet resistance of the diffused layer interconnect 35 is not so low as that of the metal interconnect but is relatively low, i.e., on the order of several $\Omega Q/\square$. And those multiple portions of the dummy diffused layer 14 are connected together by this diffused layer interconnect 35.

In the example illustrated in FIG. 12, the metal interconnects 33 for fixing the potential level are included in a metallization layer over the dummy diffused layer 14. In the example illustrated in FIG. 13 on the other hand, the metallization layer over the dummy diffused layer 14 is used only partially (i.e., around a contact 37) for fixing the potential level. That is to say, most of the metallization layer over the dummy diffused layer 14 is available for metal interconnects for other purposes. Accordingly, even the interconnects, which should make a detour around the interconnects 33 over the dummy diffused layer 14 or are included in an even higher-level layer in the embodiment shown in FIG. 12, can be formed in the metallization layer just over the dummy diffused layer 14. For example, an interconnect 38 can be formed as shown in FIG. 13. Consequently, the structure shown in FIG. 13 contributes to performance enhancement by shortening the wire length and to downsizing by increasing the efficiency of the layout process.

Embodiment 7

Figure 14A:
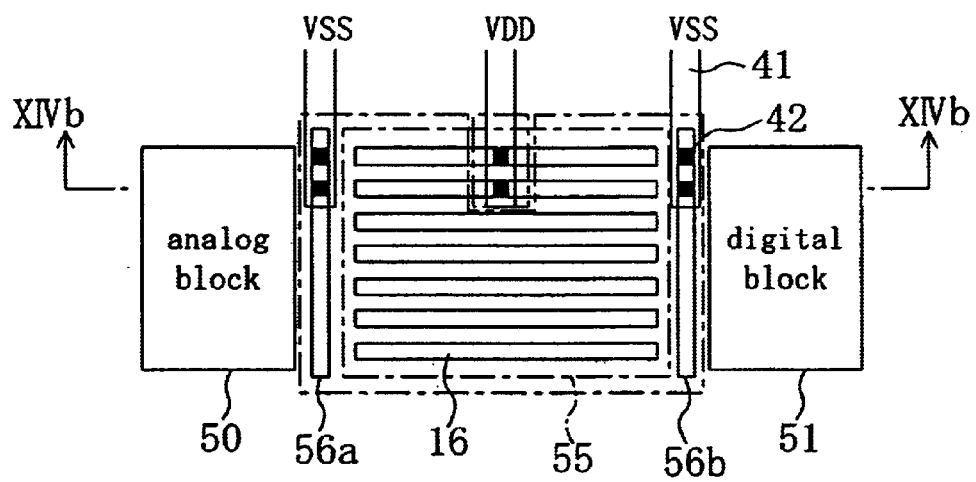
FIGS. 14A and 14B are respectively a plan view and a cross-sectional view illustrating a structure for a semiconductor device according to a seventh embodiment of the present invention.
Figure 14B:
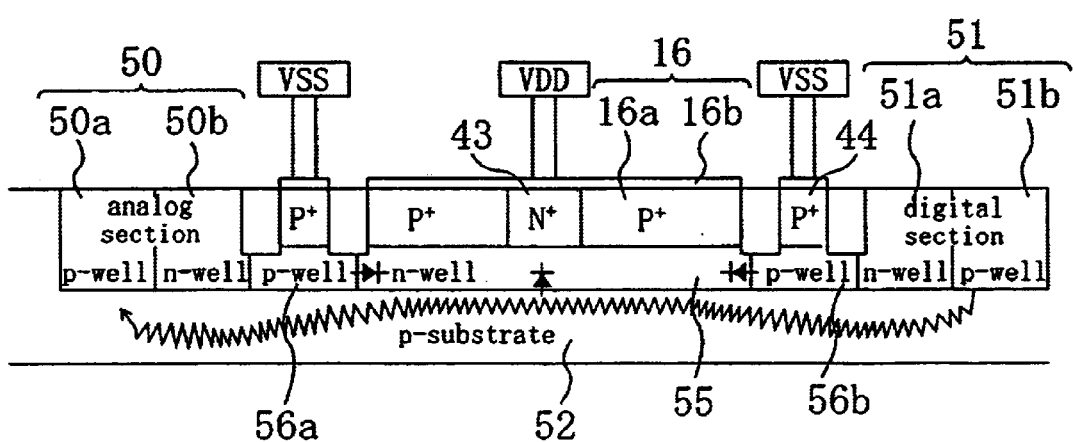
Figure 15:
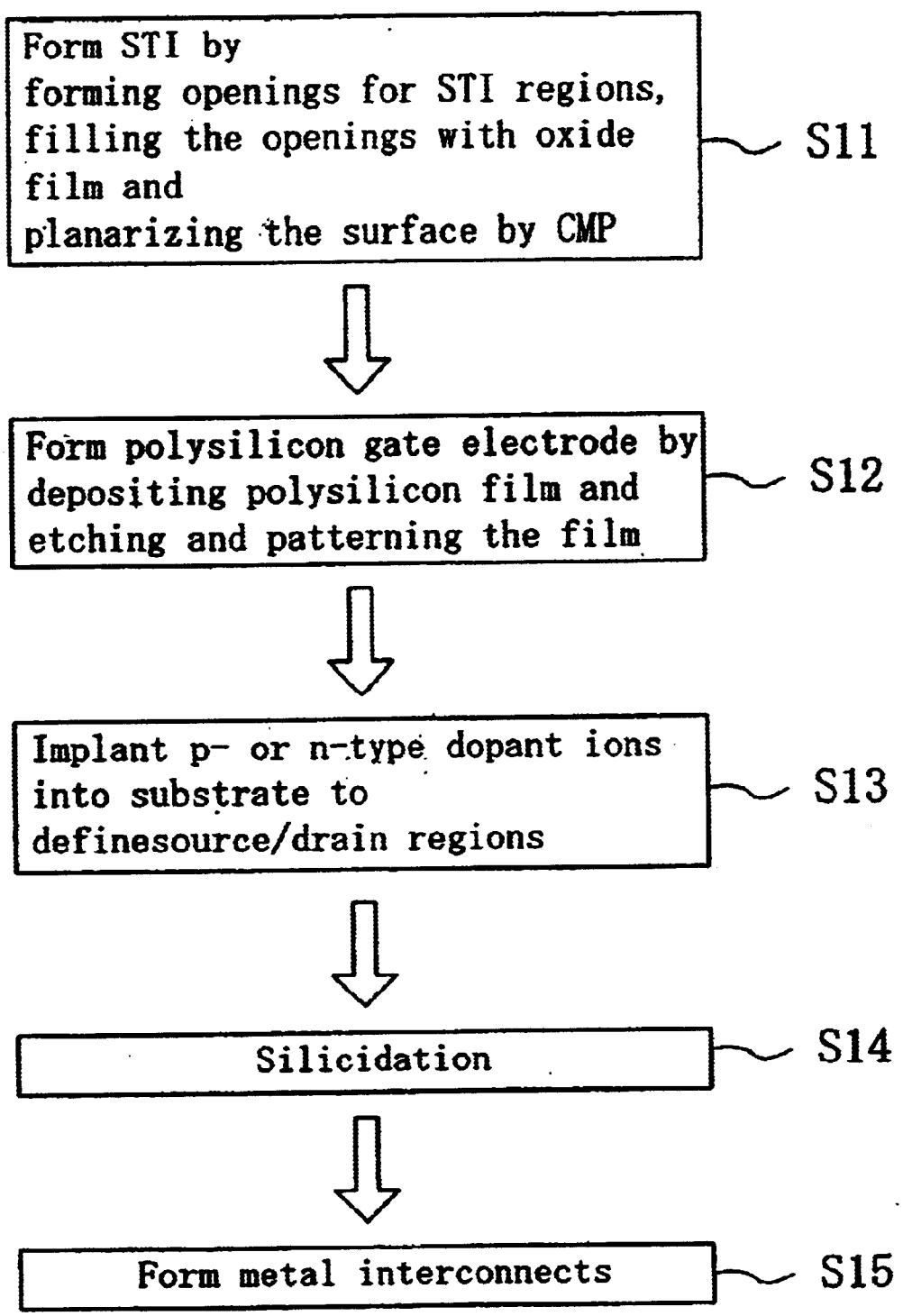
FIG. 15 is a flowchart illustrating a known semiconductor device fabrication process including the steps of forming STI regions and performing a silicidation process.

FIGS. 14A and 14B are respectively a plan view, and a cross-sectional view taken along the line XIVb—XIVb shown in FIG. 14A, illustrating a structure for a semiconductor device according to a seventh embodiment of the present invention. The seventh embodiment is a modification to the fourth embodiment illustrated in FIGS. 10A and 10B. Specifically, in the seventh embodiment, the n-well 55, surrounding the dummy diffused layer 16, has its potential level fixed at the supply voltage level VDD, while the p-wells 56a and 56b and p-type substrate 52, surrounding the n-well 55, have their potential levels fixed at the ground level VSS.

As already described for the fourth embodiment, a pn junction diode is formed by the p-type substrate 52 and n-well 55 at the bottom of the region between the dummy diffused layer 16 and p-type substrate 52 as shown in FIG. 10B. In addition, two more pn junction diodes are formed by the p-wells 56a and 56b and n-well 55 at the right- and left-hand ends of that region. That is to say, these three pn junction diodes together forms a "receptacle" for the dummy diffused layer 16.

In the seventh embodiment, the device shown in FIGS. 10A and 10B is modified in such a manner as to further increase the noise immunity thereof. Specifically, the potential level of the n-well 55 is fixed at the supply voltage level VDD and the potential levels of the p-wells 56a and 56b and p-type substrate 52 are fixed at the ground level VSS. Then, a reverse bias is applied to not only the pn junction diode formed by the p-type substrate 52 and n-well 55 but also to the pn junction diodes formed by the p-wells 56a and 56b and n-well 55. Consequently, the noise immunity of the semiconductor device improves as described for the sixth embodiment.

The p-wells 56a and 56b, located on the right- and left-hand sides of the n-well 55, are electrically connected to the p-type substrate 52. Accordingly, if it is difficult to fix the potential levels of those p-wells 56a and 56b, then the wells 56a and 56b may be opened. But the potential levels of these wells 56a and 56b are preferably fixed using metal interconnects 41, because the noise can be eliminated with much more certainty.

In the seventh embodiment, an n-type dopant should be introduced into a part 43 of the dummy diffused layer 16 that will be used as a substrate contact for fixing the potential level of the n-well 55. Also, a p-type dopant should be introduced into respective parts 44 of the dummy diffused layer 16 that will be used as substrate contacts for fixing the potential levels of the p-wells 56a and 56b. However, it is not always necessary to introduce a dopant into the other portions of the dummy diffused layer 16. This is because the pn diode exists between the p-type substrate 52 and n-well 55 as viewed from the p-type substrate 52. Nevertheless, it is more preferable to introduce the p-type dopant into the remaining portions 16a of the dummy diffused layer 16, other than the substrate contacts, as shown in FIG. 14B so that two more pn diodes are formed between the n-well 55 and dummy diffused layer 16a. Then, the silicided layer 16b is even less transparent to the p-type substrate 52 and the noise immunity of the device further improves.

A semiconductor device according to the present invention does not have to be fabricated by the method exemplified for the foregoing embodiments, but may be made by any of various other methods. Also, numerous parameters for the dummy diffused layer, including pattern size and shape, insertion pitch and percentage of the area covered by the diffused layer on the chip, are changeable depending on the specific type of the process apparatus used, process conditions and the components laid out around the device. Furthermore, the process conditions that should be met for the dummy diffused layer are fixed. Accordingly, to save the designer's time and trouble, after the layout process is finished, the dummy diffused layer may be inserted automatically when design data is subjected to computer processing using a CAD tool.

As described for the background of the invention, the dummy diffused layer is not formed just for eliminating the dishing phenomenon from an STI-CMP process. For example, the dummy diffused layer may be formed to adjust the percentage of the area covered in view of etching and lithographic processes. Even if the dummy diffused layer is formed for any other purpose, not as a countermeasure against dishing, the dummy diffused layer also has its resistance decreased and also propagates the inter-block noise unintentionally when silicided. Accordingly, the present invention is also effectively applicable to the dummy diffused layer formed for any of those other purposes.

Furthermore, the inconveniences are not caused by the noise just between the digital and analog blocks. For example, super-high-speed interface I/O ports, which have been in higher and higher demand these days, might be non-negligible noise sources. Also, to meet the demand for processes defined by an even smaller design rule and for reduction in power dissipated by various units, the logic section and memory block often need to operate at an even lower voltage applied. Generally speaking, as the operating voltage decreases, the margin affordable against the noise shrinks. Accordingly, the inter-block noise is apt to affect the logic section or memory block more and more seriously. For that reason, the present invention is also effectively applicable to a noise problem like this.

As is apparent from the foregoing description, the present invention suppresses the noise propagation by covering a dummy diffused layer with a dummy gate electrode or by surrounding the dummy diffused layer with pn junction diodes. Thus, the present invention improves the noise immunity of a semiconductor device including the dummy diffused layer.

What is claimed is:

1. A semiconductor device comprising:
   a substrate;
   a source/drain diffused layer formed in the substrate for a transistor;
   a first shallow trench isolation formed in the substrate;
   a second shallow trench isolation formed in the substrate; and
   a dummy diffused layer formed between the first and second shallow trench isolations,
   wherein the source/drain diffused layer has its surface silicided, and
   wherein the dummy diffused layer has its surface covered with an anti-silicidation film at least partially, on which no gate electrode is provided.

2. The device of claim 1, wherein the anti-silicidation film is an oxide film.

3. The device of claim 1, wherein a dopant, which has been introduced into the source/drain diffused layer, has not been introduced into the dummy diffused layer.

4. The semiconductor device of claim 1,
   wherein the dummy diffused layer is located between an analog circuit block and a digital circuit block.

5. The semiconductor device of claim 1,
   wherein the dummy diffused layer is not electrically coupled to another component via an interconnect.

6. The device of claim 1,
   wherein the dummy diffused layer is formed so as to prevent dishing.

7. The device of claim 1,
   wherein no transistor is formed between the first shallow trench isolation and the second shallow trench isolation.

8. A semiconductor device comprising:
   a substrate;
   a source/drain diffused layer formed in the substrate for a transistor; and
   a dummy diffused layer formed in the substrate,
   wherein the source/drain diffused layer has its surface silicided,
   wherein the dummy diffused layer has its surface covered with a dummy gate electrode at least partially,
   wherein the dummy diffused layer is located between a circuit block and another circuit block, and
   wherein the dummy gate electrode is divided into at least two portions disposed between the two circuit blocks.

9. The device of claim 8, wherein a dopant, which has been introduced into the source/drain diffused layer, has not been introduced into the dummy diffused layer.

10. The device of claim 8, wherein the dummy diffused layer is not electrically coupled to another component via an interconnect.

11. A semiconductor device comprising:
    a substrate;
    a source/drain diffused layer formed in the substrate for a transistor; and a dummy diffused layer formed in the substrate, wherein the source/drain diffused layer has its surface silicided, wherein the dummy diffused layer has its surface covered with a dummy gate electrode at least partially, and wherein the dummy gate electrode has a fixed potential level.

12. A semiconductor device comprising:

a substrate;

a source/drain diffused layer formed in the substrate for a transistor; and a dummy diffused layer formed in the substrate, wherein the source/drain and dummy diffused layers have their surfaces silicided, wherein a well of a first conductivity type is defined in the substrate, and wherein the dummy diffused layer is formed in the well and a dopant of a second conductivity type has been introduced into the dummy diffused layer, the second conductivity type being opposite to the first conductivity type.

13. The device of claim 12, wherein the dummy diffused layer has a fixed potential level.

14. The device of claim 13, wherein the potential level of the dummy diffused layer is fixed at such a level as applying a reverse bias to a pn junction diode formed by the dummy diffused layer and the well.

15. The device of claim 13, wherein the dummy diffused layer is divided into multiple portions, and wherein the portions of the dummy diffused layer are connected together by silicide diffused layer interconnects that have been formed in the same layer as the dummy diffused layer.

16. A semiconductor device comprising:

a substrate of a first conductivity type;

a source/drain diffused layer, which is formed in the substrate for a transistor and has its surface silicided;

a first well of a second conductivity type, the first well being defined in the substrate, the second conductivity type being opposite to the first conductivity type;

a dummy diffused layer formed in the first well and located between two circuit blocks; and a second well of the first conductivity type, the second well being defined between the first well and one of the two circuit blocks.

17. The device of claim 16, wherein potential levels of the first and second wells are fixed at such levels as applying a reverse bias to a pn junction diode formed by the first and second wells.

18. A semiconductor device comprising:

a substrate;

a source/drain diffused layer formed in the substrate for a transistor; and a dummy diffused layer formed in the substrate, wherein the source/drain diffused layer has its surface silicided, wherein the dummy diffused layer has its surface covered with a dummy gate electrode at least partially, and wherein the dummy diffused layer is located between a digital circuit block and an analog circuit block.

* * * * *

UNITED STATES PATENT AND TRADEMARK OFFICE
CERTIFICATE OF CORRECTION

PATENT NO.     : 6,838,736 B2
DATED          : January 4, 2005
INVENTOR(S)    : Satoshi Ishikura et al.

It is certified that error appears in the above-identified patent and that said Letters Patent is hereby corrected as shown below:

<u>Title page,</u>
Item [56], References Cited, U.S. PATENT DOCUMENTS, please add
-- 6,455,894 B1 * 09/24/2002 Matsumoto et al. .....................257/347 --

Signed and Sealed this

Third Day of May, 2005

JON W. DUDAS
*Director of the United States Patent and Trademark Office*